United States Patent [19]
Yoshiura et al.

[11] Patent Number: 6,122,378
[45] Date of Patent: Sep. 19, 2000

[54] DATA COMPRESSION/ENCRYPTION METHOD AND SYSTEM

[75] Inventors: Hiroshi Yoshiura, Kawasaki; Kazuo Takaragi, Ebina; Yusuke Hino; Yutaka Otsu, both of Hadano, all of Japan

[73] Assignee: Hitachi, Ltd., Tokyo, Japan

[21] Appl. No.: 09/029,547

[22] PCT Filed: Sep. 13, 1995

[86] PCT No.: PCT/JP95/01815

§ 371 Date: Mar. 5, 1998

§ 102(e) Date: Mar. 5, 1998

[87] PCT Pub. No.: WO97/10659

PCT Pub. Date: Mar. 20, 1997

[51] Int. Cl.$^7$ ...................................................... H04N 1/44
[52] U.S. Cl. ............................ 380/217; 380/37; 380/269; 708/203
[58] Field of Search ................................ 380/9, 4, 37, 50, 380/217, 269; 708/203, 204; 712/13; 382/246; 341/65

[56] References Cited

U.S. PATENT DOCUMENTS

| | | | |
|---|---|---|---|
| 5,097,504 | 3/1992 | Camion et al. | 380/23 |
| 5,285,497 | 2/1994 | Thatcher, Jr. | 380/49 |
| 5,479,512 | 12/1995 | Weiss | 320/28 |
| 5,802,599 | 9/1998 | Cabrera et al. | 711/170 |

FOREIGN PATENT DOCUMENTS

| | | | |
|---|---|---|---|
| 60-164787 | of 1985 | Japan | G09C 1/00 |
| 4-119386 | of 1992 | Japan | G09C 1/00 |
| 4-296169 | of 1992 | Japan | H04N 1/44 |
| 4-37367 | of 1992 | Japan | H04N 1/41 |
| 5-333772 | of 1993 | Japan | G09C 1/00 |
| 6-112840 | of 1994 | Japan | H03M 7/40 |

OTHER PUBLICATIONS

"The Data Compression Book", by M. Nelson, 1992 by M&T Publishing, Inc.
"Studies of Data Protection and Encryption", Nikon Keizai Shimbun, Inc. (1983), pp. 73–153.
"Compiler", Sangyo Toshio, Ltd., (1981), pp. 41–140.
IEEE Transactions of Information Theory, "Correlation–Immunity of Nonlinear Combining Functions for Cryptographic Applications", T. Siegenthaler, vol. IT–30, No. 5, Sep. 1984.
Holtz, K., "Data Compression for Disc Files and Communications Networks," WESCON/'93, Sep. 30, 1993, pp. 146–151.
Lee, L.–N., "Digital coding of High–Definition Television (HDTV) Signals," Military Communications Conference, 1990. MILCOM '90, Oct. 3, 1990, vol. 1, pp. 22–26.

Primary Examiner—Tod R. Swann
Assistant Examiner—Justin T. Darrow
Attorney, Agent, or Firm—Antonelli, Terry, Stout & Kraus, LLP

[57] ABSTRACT

An information processing system including a data input means (203, 208, 217, 219) for inputting or receiving data, a data compressing means (206) for compressing the data, a decompressing means (221) for decompressing the compressed data and a main storage (209, 222) is provided with an encrypting means (207) for encrypting the data and a decrypting means (220) for decrypting the encrypted data. In execution of a compression/encryption step in which the compressing means (206) and the encrypting means (207) perform compression and encryption for a part of the data and a decryption/decompression step in which the decompressing means (221) and the decrypting means (220) perform decompression and decryption for a part of the compressed and encrypted data, amounts of series of data processed in the compression/encryption and decryption/decompression steps are so set that a memory capacity required for executing the processings does not exceed capacity of the main storage, wherein the compression/encryption and decryption/decompression steps are repeated more than once inclusive.

6 Claims, 17 Drawing Sheets

FIG.10
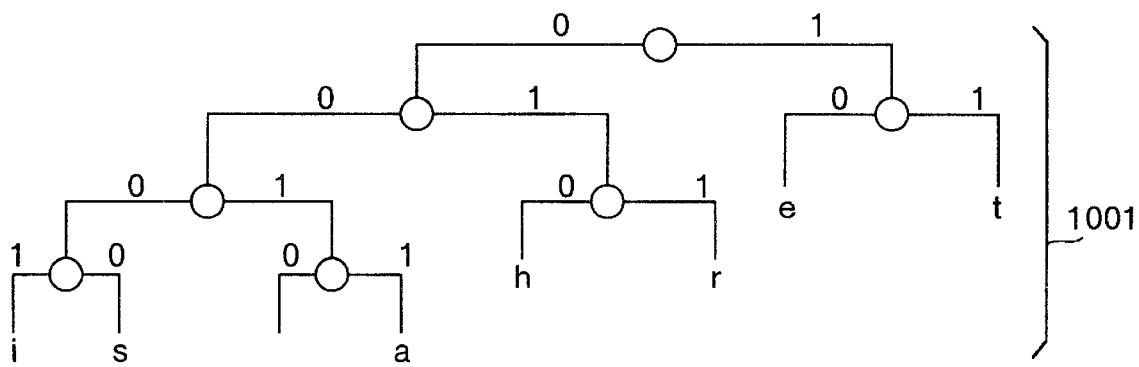
1001
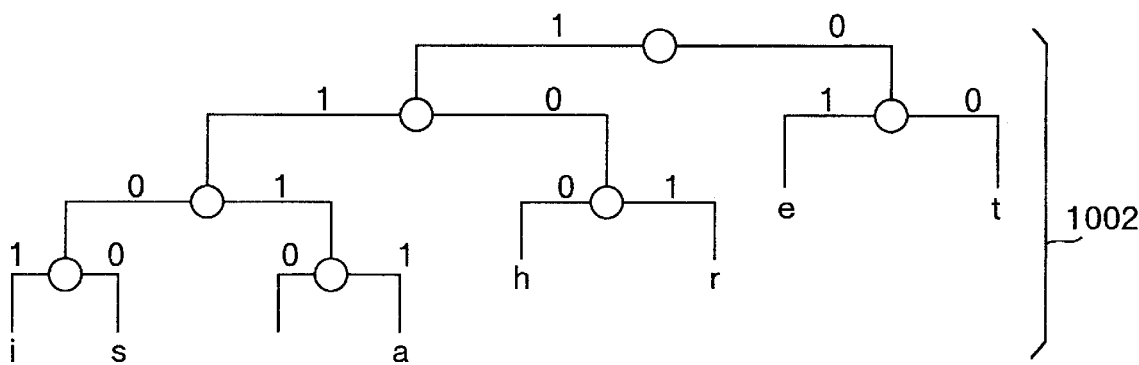
1002
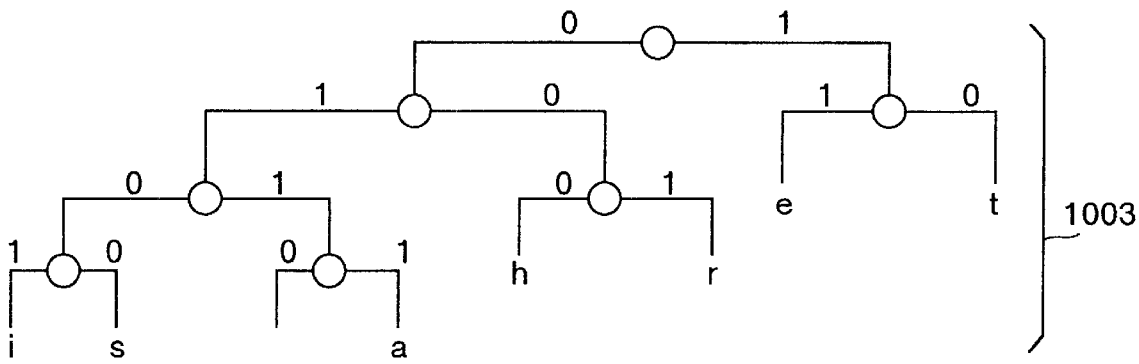
1003
FIG.11
01010····

DATA COMPRESSION/ENCRYPTION METHOD AND SYSTEM

FIELD OF THE INVENTION

The present invention relates to compression and encryption of data and more particularly to a data compression/encryption method and a system therefor which are designed to enhance the processing efficiency while reducing power consumption in performing compression processing as well as encryption processing on data.

BACKGROUND ART

In accompanying with rapid increase in utilization of communication facilities, there arises an increasing trend of compressing and encrypting (hereinafter referred to as compression/encryption or compressing/encrypting for short) the data with a view to enhancing the efficiency of communications and preventing unauthorized acquisition and falsification of the data for communication. In particular, in the case of wireless communications, since interception is easy because of narrow band, the compression/encryption is indispensable. On the other hand, in the portable type computers commanding high popularity in recent years, duration of a battery provides an important problem, giving rise to a demand for the data processing methods suited for economization of electric energy. For these reasons, the compression/encryption techniques which can ensure high efficiency and low power consumption are demanded as being indispensable.

In the conventional compression/encryption techniques known heretofore, data is first compressed and then written into a secondary storage such as a hard disk drive or the like, whereon the compressed data is read out from the secondary storage to be encrypted. In the encryption processing, the same encryption processing as that for the non-compressed data is adopted without taking into consideration the fact that the data are compressed. Further, in the processing for restoring the original data from the compressed/encrypted data (this process will hereinafter be referred to as the decryption/decompression processing), the data is decrypted at first and then written in the secondary storage, whereon the decrypted data is read out from the secondary storage to be restored or decompressed.

In the conventional compression/encryption technique described above, the compression processing and the encryption processing are executed independent of each other without exploiting the possibility that the processing efficiency can be enhanced by integrating or combining together the compression processing and the encryption processing. Besides, because the compression processing and the encryption processing on one hand and the decryption processing and the decompression processing on the other hand are interlocked by way of the secondary storage, not only a time is taken for reading/writing data in/from the secondary storage but also a large amount of electric energy is consumed for the read/write operation.

SUMMARY OF THE INVENTION

An object of the present invention is to provide a data compression/encryption method and a system therefor which are capable of enhancing the efficiency of processings involved in the compression/encryption as well as the decryption/decompression while reducing the power consumption by combining together the compression processing and the encryption processing for thereby rendering it unnecessary to interlock the compression processing and the decompression processing on one hand and the decryption processing and the decompression processing on the other hand by way of the secondary storage.

In order to make the interlock unnecessary between the compression processing and the encryption processing on one hand and between the decryption processing and the decompression processing on the other hand by way of the secondary storage, an amount of data processed at a time is limited so that a memory capacity required for performing the compression/encryption processings and the decryption/decompression processings does not exceed the capacity of a main storage of a relevant information processing system. In other words, the amount of the data processed at a time is partitioned such that a memory capacity required for performing the compression/encryption processings and the decryption/decompression processings does not exceed the capacity of the main storage of the relevant information processing system, and then, the data compression/encryption processings are executed sequentially and repetitively on a partitioned-data basis to thereby compress and encrypt one set of data wholly.

More specifically, according to a first method of the present invention, an encrypting means and a decrypting means are provided in an information processing system which includes a compressing means and a decompressing means for the data, wherein the amount of data to be compressed and encrypted or the amount of data to be decrypted and decompressed is set so that the memory capacity required upon application of the compressing means and the encrypting means to the data as well as the memory capacity required upon application of a decrypting means and the decompressing means to the data does not exceed the capacity of the main storage incorporated in the relevant information processing system. The application of the compressing means and the encrypting means or the application of the decrypting means and the decompressing means to the data of the amount as set is repeated to thereby compress and encrypt or decrypt and decompress the whole data.

Next, a description will be directed to the enhancement of the processing efficiency owing to the combination of the compression processing and the encryption processing. As is described in "DATA COMPRESSION HANDBOOK" published by TOPPAN-PUB. (1994), pp. 21–247, there are known undermentioned methods (1) to (3) as the conventional compressing methods. In practical data compression programs, combination of the methods (1) and (3) or alternatively combination of the methods (2) and (3) is adopted in many cases.

(1) Method based on a fixed statistical model such as e.g. fixed Huffman coding.

(2) Method based on an adaptive statistical model such as e.g. adaptive Huffman coding.

(3) Dictionary base method such as e.g. LZ77 and LZ78.

The compression/encryption method according to the present invention is applicable to the above-mentioned methods (1) and (2). Furthermore, although the present invention can not find application straight-forwardly to the method (3), the invention is applicable to the combination of the methods (1) and (3) or the combination of the methods (2) and (3).

In the first place, a description will be made of incorporation of the encryption processing in the compression processing based on the fixed statistical model. According to the compression method based on the fixed statistical model, occurrence probabilities of individual symbols are determined by resorting to a method of checking the frequencies at which the individual symbols make appearance in the data. On the basis of the occurrence probability of the symbol, correspondence information between the symbol and a bit string corresponding thereto (Huffman tree in the case of Huffman coding) is generated. In that case, the symbol making the appearance at higher probability is assigned with a shorter bit string upon establishing the correspondence between them. Subsequently, the symbols contained in the data are translated into corresponding bit strings for thereby compressing the data. In the decryption processing, the compressed data and the symbol-bit string correspondence information (or occurrence frequencies or occurrence probabilities of the symbols for generating the symbol-bit string correspondence information) are received to restore the original data through reverse translation of the bit strings into the symbols, respectively.

In the compression method based on the fixed statistical model as mentioned above, the data restoration is impossible unless the symbol-bit string correspondence information can not be made use of. In this conjunction, it is however noted that by encrypting only the symbol-bit string correspondence information, the intrinsic aim of the encryption can be achieved. Because the amount of the symbol-bit string correspondence information is extremely small when compared with that of the compressed data, overheads involved in the encryption processing as well as the corresponding decryption processing can be reduced remarkably when compared with the conventional method of encrypting the compressed data themselves. Thus, according to a second method taught by the present invention, the symbol-bit string correspondence information is encrypted in the compression processing based on the fixed statistical model.

With only the encryption of the symbol-bit string correspondence information, immunity of the encrypted data (degree of difficulty in cryptanalysis) may be insufficient in some cases. In other words, for the encryption described above, there may be conceived unauthorized cryptanalysis methods mentioned below.

(a) By acquiring a plurality of similar data and corresponding compressed data and comparing them, the trend underlying the correspondences established between the symbols and the bit strings according to the above-mentioned scheme is estimated.

(b) When a same symbol and/or a same symbol string occur repeatedly in one data, correspondence between the symbol and the bit string can be estimated by analyzing the repeating pattern contained in the corresponding compressed data.

For preventing the cryptanalysis mentioned in the above paragraph (a), such measures may be taken that correspondences between the symbols and the bit strings become utterly different for the data differing even a little. In the case of the compression based on the fixed statistical model, the length of a bit string corresponding to a symbol is determined in dependence on the occurrence probability of the symbol, as described previously. However, the bit string of a given length has a degree of freedom in respect to the array of "0" and "1". By way of example, assuming that the length of the bit string corresponding to the symbol a has been determined to be "4", there exists a degree of freedom in the bit array such as "0000", "0101" "1101" etc. Under the circumstances, such arrangement is adopted that the bit string corresponding to the symbol is selected from a plurality of possible candidates such as mentioned above in dependence on an accidental or probabilistic factor such as a random number. By adopting this method, correspondences between the symbols and the bit strings become utterly different upon every computation for the data compression even for the data differing only a little (even for the utterly same input data). Consequently, it becomes difficult to estimate the trend in establishing the correspondence. Thus, according to a third method of the present invention, correspondence between the symbol and the bit string is realized by resorting to computation based on accident or probability in the second method described hereinbefore.

The cryptanalysis mentioned previously in the paragraph (b) can be prevented by changing a method of establishing the correspondences between the symbols and the bit strings in the course of the data processing. Thus, according to a fourth method of the present invention, the procedure for establishing correspondences between the symbols and the bit strings is changed in the course of the data processing in the second method described hereinbefore.

In order to intensify the immunity of the encryption described above, a second encrypting means may be provided for further encrypting the encrypted data. To this end, however, it is sufficient to implement the second encrypting means such that more simplified processing as compared with that of the conventional encrypting means for the simple compressed data can be performed for the reasons mentioned below.

(a) The second encrypting means is destined for further encrypting the already encrypted data.

(b) Measures for coping with the cryptanalysis method such as comparison of the similar data, analysis of the repeating pattern and the like have already been taken.

Thus, according to a fifth method of the present invention, a simplified encryption is additionally carried out for the encrypted data in the second to fourth methods, respectively.

Next, description will turn to incorporation of the encryption processing in the aforementioned method (2) based on the adaptive statistical model. In the data compression based on the adaptive statistical model, predicted values of the occurrence probabilities of the symbols are employed instead of determining the occurrence probabilities of symbols by previously examining or checking the data, differing from the data compression based on the fixed statistical model. As the initial predicted values of the occurrence probabilities, it is presumed, for example, that the occurrence probabilities of all the symbols are equal. On the basis of such predicted value, the symbols are translated into bit strings, respectively, while the predicted value is modified (by incrementing the predicted value of the occurrence probability for the symbol processed while decrementing the predicted values of the occurrence probabilities for the other symbols). By repeating the translation of the symbol into the bit string and the modification of the predicted value of the occurrence probability, the whole data is compressed. In the decompression processing, the compressed data is received, whereon the data is decompressed or restored by repeating the reverse translation of the bit strings to the symbols by using the same initial predicted value for the occurrence probability as used in the compression processing and the modification of the predicted value of the occurrence probability.

In the case of the above-mentioned compression method based on the adaptive statistical model, when a certain portion or part of the compressed data is to be decompressed, it is necessary to decompress all the data portions preceding to the certain portion to thereby determine the predicted value of the occurrence probability at that time point. Accordingly, encryption of a leading portion of the compressed data is equivalent to the encryption of all the compressed data even when the succeeding data portion is not encrypted. Thus, according to a sixth method taught by the present invention, a leading portion or part of the compressed data is compressed in the compression processing based on the adaptive statistical model.

Similarly to the case of the fixed statistical model, there may be conceived for the method described above such unauthorized cryptanalysis methods as mentioned below.

(a) By acquiring a plurality of similar data and corresponding compressed data and comparing them, the trend of correspondence established between the symbols and the bit strings according to the scheme described just above is estimated.

(b) In general, because a predicted value of occurrence probability for the symbol does not change sharply in the course of the data processing, the correspondence as established between the symbol and the bit string will not change sharply either. Consequently, when a same symbol and/or a same symbol string occur repeatedly in one data, the similar patterns make appearance repeatedly in the compressed data. By analyzing the repetitive pattern, the correspondence between the symbol and the bit string is estimated.

The unauthorized cryptanalysis mentioned above in the paragraph (a) can be coped with the third method mentioned previously by establishing the correspondence between the symbol and the bit string by the computation based on accident or probability, similarly to the case of the method based on the fixed statistical model. The cryptanalysis mentioned above in the paragraph (b) can be prevented by changing the procedure of establishing the correspondences between the symbols and the bit strings in the course of the data processing on the basis of information other than the predicted value of the occurrence probability for the symbol. The length of a bit string corresponding to a symbol is determined in dependence on the predicted value of the occurrence probability for the symbol, as in the case of the method based on the fixed statistical model. However, in the bit string of a given length, there is a degree of freedom in respect to the array of "0" and/or "1". Accordingly, the procedure for setting correspondences between the symbols and the bit strings may be changed independent of the occurrence probability of the symbol in the course of the data processing. Thus, according to a seventh method taught by the present invention, the procedure for establishing correspondences between the symbols and the bit strings are changed on the basis of information other than the occurrence probabilities of the symbols.

According to the first method of the present invention described hereinbefore the amount of the data to be compressed and encrypted or the amount of the data to be decrypted and decompressed is set so that the memory capacity required for application of the compressing means and the encrypting means to the data as well as the memory capacity required for application of the decrypting means and the decompressing means to the data does not exceed the capacity of the main storage incorporated in the relevant information processing system. Thus, the compression/encryption processings as well as the decryption/decompression processings can be performed internally of the main storage, whereby the write/read operations of the interim results to/from the secondary storage is rendered unnecessary, which in turn means that improvement of the efficiency and reduction of the power consumption can be achieved.

According to the second method, the symbol-bit string correspondence information is encrypted in the compression processing based on the fixed statistical model, whereby the compressed data is rendered unable to be restored, which brings about the same effect as the encryption of the compressed data itself. The amount of the compressed data is usually several kilo to several mega bytes. By contrast, the symbol-bit string correspondence information is on the order of the amount equal to the number of different symbols multiplied by one byte, which is negligibly small. Thus, according to this method, efficiency of the encryption as well as the corresponding decryption can be enhanced.

According to the third method, the correspondence between the symbol and the bit string is determined by the computation which is based on accident or probability. Consequently, correspondence between the symbol and the bit string become completely different every time the processing according to the instant method is activated. Thus, difficulty will be encountered in attempting to estimate the trend of the correspondences established between the symbols and the bit strings, which means that the degree of immunity of the encrypted data is intensified.

According to the fourth method, the procedure of setting the correspondences between the symbols and the bit strings is changed in the course of the data processing. Consequently, no repetitive pattern can make appearance in the encrypted data. Thus, the immunity of the encrypted data can be intensified.

According to the fifth method, the data encrypted by the method(s) mentioned above undergoes additional encryption by the second encrypting means, whereby the immunity of the encrypted data is intensified. Owing to such duplicate encryption, it is sufficient to implement the second encrypting means in a simple structure, whereby the encryption efficiency can be enhanced. Furthermore, because the decryption becomes simple as the corresponding encryption is simple, efficiency of the decryption can be enhanced as well.

According to the sixth method, the leading portion or part of the compressed data is encrypted in the compression processing based on the adaptive statistical model, whereby prediction of the occurrence probabilities of the symbols in the trailing data portion is rendered difficult, which means equivalently that the whole compressed data are eventually encrypted. Owing to the encryption only of the leading data portion, enhanced efficiency can be realized when compared with the conventional method of encrypting the whole compressed data with the efficiency of the corresponding decryption being improved as well.

According to the seventh method, the procedure of establishing correspondences between the symbols and the bit strings is abruptly changed on the basis of information other than the predicted values of the occurrence probabilities of the symbols. Thus, the repetitive pattern in the data can not make appearance in the encrypted data. Consequently, immunity of the encrypted data is intensified.

BRIEF DESCRIPTION OF DRAWINGS

FIG. 10 is a view illustrating, by way of example, a modification of the symbol-bit string correspondence information shown in FIG. 9, FIG. 11 is a view showing, by way of example, compressed and encrypted data.

DESCRIPTION OF THE PREFERRED EMBODIMENTS

Now, the present invention will be described in more detail by reference to the accompanying drawings. The following description is directed to three exemplary embodiments of the present invention.

Figure 1:
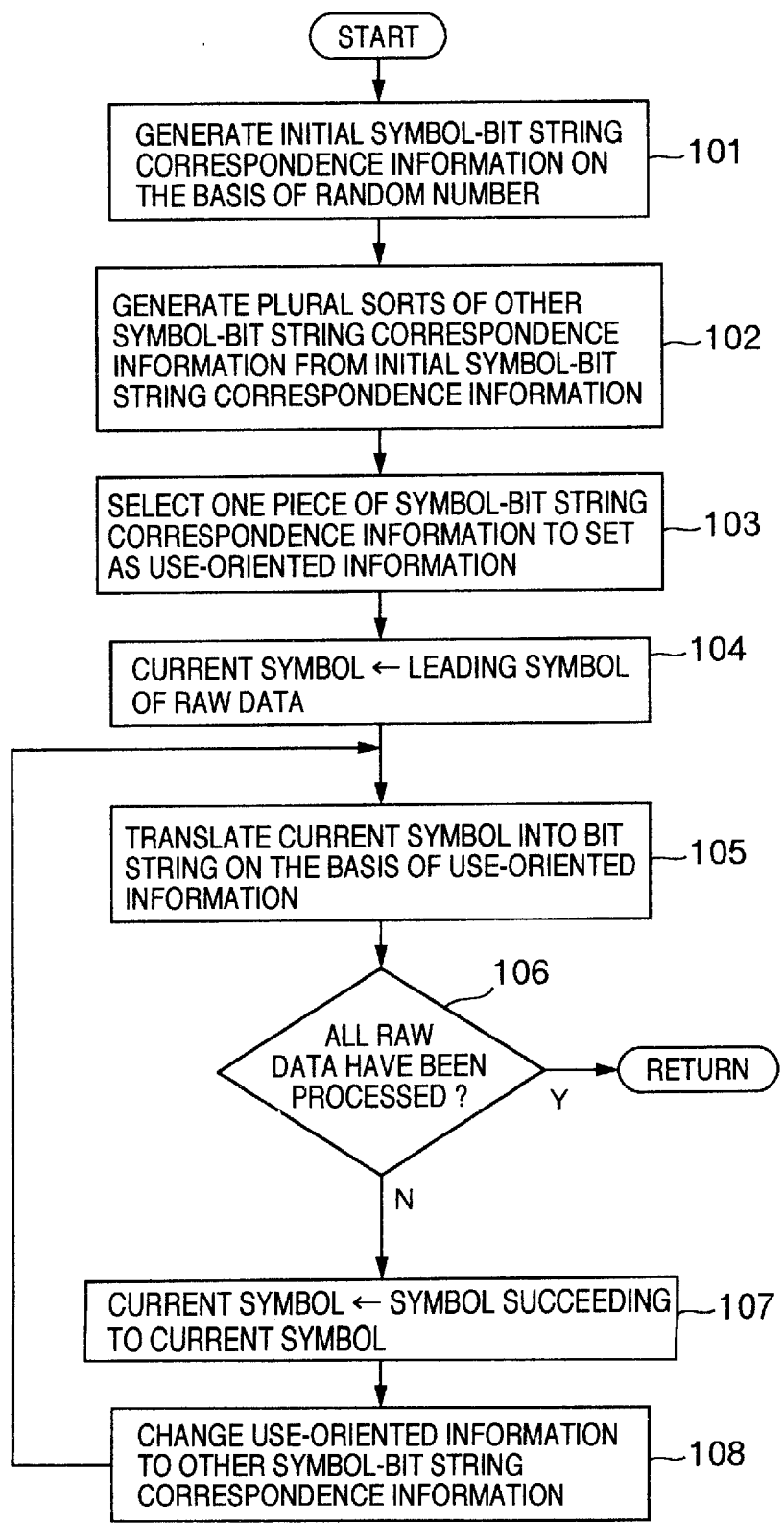
FIG. 1 is a flow chart for illustrating a compression processing method according to a first exemplary embodiment of the present invention.
Figure 2:
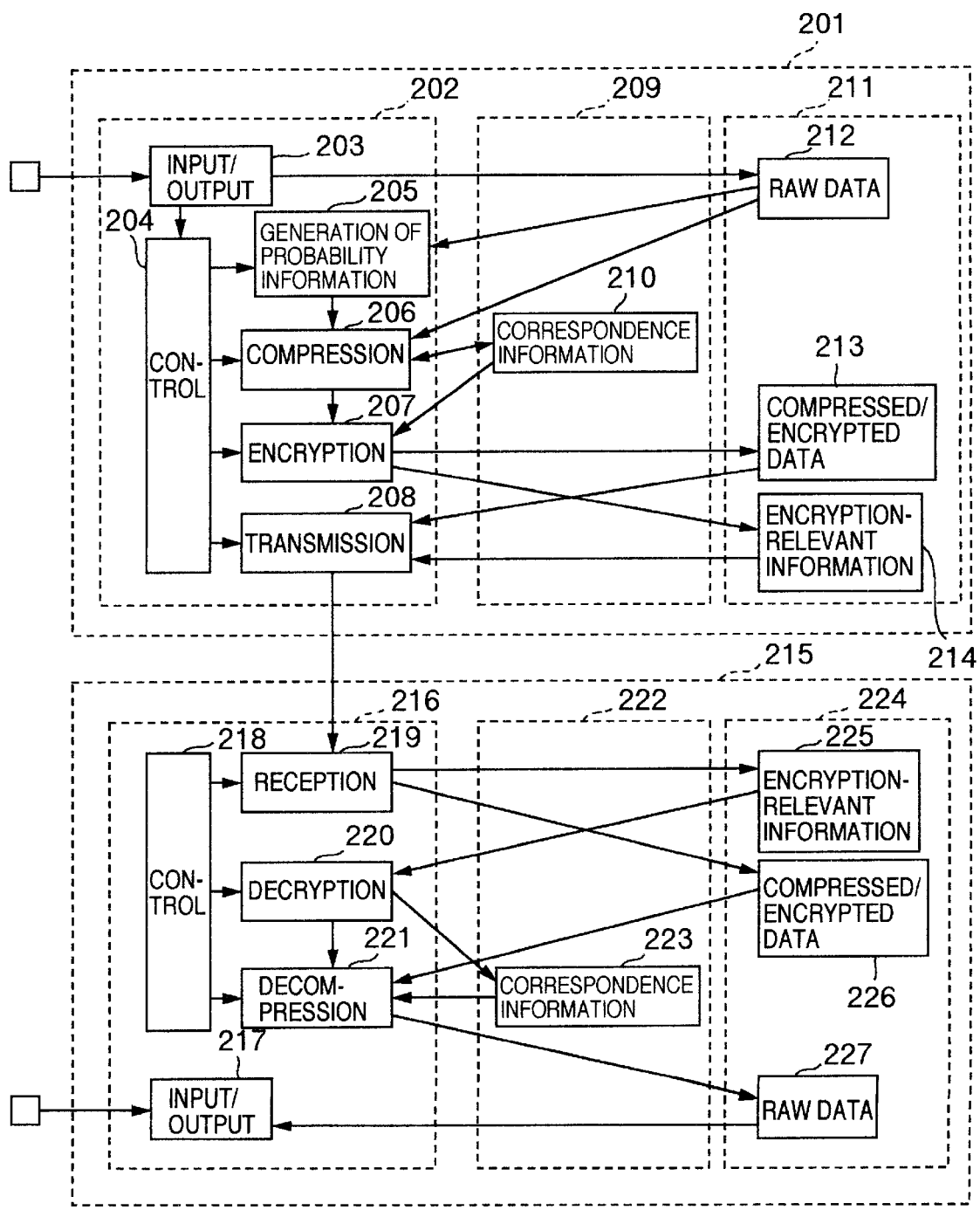
FIG. 2 is a view showing a functional configuration of the first exemplary embodiment of the invention.

At first, a first exemplary embodiment will be elucidated by reference to FIG. 1 to FIG. 11. The first exemplary embodiment is directed to concrete examples for carrying the first to fifth methods for executing repetitively the compression/encryption processings on the data each of an amount which does not exceed the capacity of a main storage incorporated in a relevant information processing system as described hereinbefore. The compression/encryption processing now of concern is composed of an encryption processing incorporated in a fixed Huffman compression procedure which is a typical one of the compression procedure based on a fixed statistical model. FIG. 2 shows a functional configuration diagram illustrating the system according to the first exemplary embodiment of the invention. Blocks 201 and 215 represent completed information processing systems, respectively, which can operate independent of each other, wherein data can be sent from the block 201 to the block 215 via a communication line.

A block 202 represents processings which are executed by a central processing unit and I/O units and includes individual processings, i.e., input/output processing 203, control processing 204, probability information generation processing 205, compression processing 206, encryption processing 207 and transmission processing 208. A block 209 represents a main storage implemented by a RAM (random access memory) or the like to serve for storage of occurrence probability information 210. A block 211 represents a secondary storage implemented by a hard disk drive or the like to serve for storage of raw data 212, compressed/encrypted data 213 and encryption-relevant information 214.

A block 216 represents processings which are executed by the central processing unit and I/O units and includes individual processings, i.e, input/output processing 217, control processing 218, reception processing 219, decryption processing 220 and decompression processing 221. A block 222 represents a main storage implemented by a RAM (random access memory) or the like to serve for storage of correspondence information 223. A block 224 represents a secondary storage implemented by a hard disk drive or the like to serve for storage of encryption-relevant information 225, compressed/encrypted data 226 and raw data 227.

Through the input/output processing 203, raw data are inputted to be stored in the secondary storage 211. Further, a compression/encryption command and a data send command are inputted to be transferred to the control processing 204 through the input/output processing. Upon reception of the compression/encryption command, the control processing 204 sequentially activates the probability information generation processing 205, the compression processing 206 and the encryption processing 207 to thereby execute repetitionally the steps of compressing/encrypting the raw data on a part-by-part basis, whereby all the raw data are compressed and encrypted to be subsequently stored in the secondary storage 211. Additionally, information indicating correspondences between symbols and bit strings (also referred to as the symbol-bit string correspondence information) obtained in the course of execution of the above-mentioned processings is also encrypted and stored in the secondary storage 211. In this conjunction, the amount of the raw data undergone the compression/encryption at a time or in one step is set so that the memory capacity required for the compression/encryption processings does not exceed the capacity of the main storage incorporated in the information processing system 201. Additionally, upon reception of the transmission command for sending the compressed/encrypted data, the control processing 204 activates the transmission processing 208 for thereby causing the compressed/encrypted data and the encrypted symbol-bit string correspondence information to be sent to the information processing system 215.

Using the probability information generation processing 205, an occurrence probability symbol in the raw data is determined by counting the frequency at which the symbol makes an appearance in the raw data, whereon the symbol occurrence probability information is transferred to the compression processing 206. In the compression processing 206, the symbol-bit string correspondence information is generated on the basis of the symbol occurrence probability information and stored in the main storage 209. Besides, a part of the raw data 212 is compressed and encrypted by referencing the above-mentioned symbol-bit string correspondence information and then transferred to the encryption processing 207. This processing will be described in more detail later on by reference to FIG. 1, FIG. 3, FIG. 4, FIG. 5 and FIG. 6.

The encryption processing 207 as activated receives the compressed data from the compression processing 206 to encrypt the compressed data, whereon the compressed/encrypted data is stored in the secondary storage 211. Additionally, in the encryption processing 207, the symbol-bit string correspondence information is read out from the main storage 209 to be encrypted and stored in the secondary storage 211. To this end, there may be adopted a conventional symmetric key encryption or asymmetric key encryption scheme such as described in "STUDIES OF DATA PROTECTION AND ENCRYPTION" published by Nihon Keizai Shimbun Inc. (1983), pp. 73–153.

Using the transmission processing 208, the compressed/encrypted data as well as the encrypted symbol-bit string correspondence information is sent to the information processing system 215.

Upon reception of the decrypting/decompressing command, the input/output processing 217 transfers the command to the control processing 218. Additionally, the raw data 227 stored in the secondary storage 224 is read out. The control processing 218 then activates sequentially the decryption processing 220 and the decompression processing 221 to thereby execute repetitionally the steps of decrypting and decompressing the compressed/encrypted data 226, whereon the raw data is stored in the secondary storage 224. In this conjunction, the amount of the compressed/encrypted data undergoing the decryption/decompression at a time or in a single step is so set that the memory capacity required for the decryption/decompression processings does not exceed the capacity of the main storage of the relevant system 215.

Upon reception of the encrypted symbol-bit string correspondence information and the compressed/encrypted data from the transmission processing 208, the reception processing 219 stores these data in the secondary storage 224. In the decryption processing 220, the encrypted symbol-bit string correspondence information is decrypted by the translation reverse to that in the encryption processing 207, whereon the decrypted information is stored in the main storage 222. Additionally, the compressed/encrypted data is decrypted to be transferred to the decompression processing 221.

Upon reception of the compressed data from the decryption processing 220, the decompression processing 221 decompresses the compressed data on the basis of the symbol-bit string correspondence information stored in the main storage 222, whereby the data as is stored in the secondary storage 224. This processing will be described in more detail later on by reference to FIG. 7.

FIG. 1 is a flow chart illustrating operations involved in executing the compression processing 206 shown in FIG. 2. In a step 101, a random number is generated, whereon a set of symbol-bit string correspondence information is generated from the symbol occurrence probability information on the basis of the value of the random number. This information is then stored in the main storage 209. This symbol-bit string correspondence information will be referred to as the initial symbol-bit string correspondence information. The symbol-bit string correspondence information can be represented in the form of a binary tree (referred to as the Huffman tree) where the individual symbols are disposed at leaf nodes (terminal nodes), respectively, wherein an array of "0" and "1" added to branches intervening between the root node and the symbol represents the bit string corresponding to the symbol. In the case of the example illustrated in FIG. 3, symbol "a" corresponds to "000", "b" corresponds to "011" and "e" corresponds to "1". For more particulars of the step 101, description will be made later on by reference to FIG. 4.

In a step 102, other symbol-bit string correspondence information is generated from the initial symbol-bit string correspondence information. Further particulars of this processing will be described later on by reference to FIG. 5. In a step 103, one information is selected from the initial symbol-bit string correspondence information and the other symbol-bit string correspondence information as use-oriented information.

In a step 104, the leading symbol of the raw data of concern (a portion of the whole raw data designated by the control processing 204) is defined as a current symbol. In a step 105, the current symbol is translated into a bit string on the basis of the use-oriented information.

In a step 106, a decision is made as to whether or not all the raw data of concern have been processed. If all the raw data have been processed, return is made to the start step. If otherwise, the processing proceeds to a step 107 in which a symbol which succeeds to the current symbol is newly defined as the current symbol. In a step 108, the use-oriented information is changed to the other symbol-bit string correspondence information than the information corresponding to the current use-oriented information, whereupon the step 105 is resumed. For realizing such change, there may be adopted, for example, a method mentioned below.

It is assumed that there are available L sorts of symbol-bit string correspondence information. On this assumption, the individual pieces of symbol-bit string correspondence information are affixed with identification numbers "0" to "L−1", respectively. It is further assumed that the bit string determined in the step 104 is regarded as a numeral having a value v and the symbol-bit string correspondence information selected currently as the use-oriented information has an identification number w. On these assumptions, when a remainder resulting from the division of (v+w) by L is y, the remainder y is represented by an integer greater than "0" inclusive and smaller than (L−1) inclusive. The y-th symbol-bit string correspondence information is selected as the new use-oriented information. Owing to this method, the symbol-bit string correspondence information to be next used can be selected in dependence on the symbol processed immediately before and the symbol-bit string correspondence information being used currently.

Figure 4:
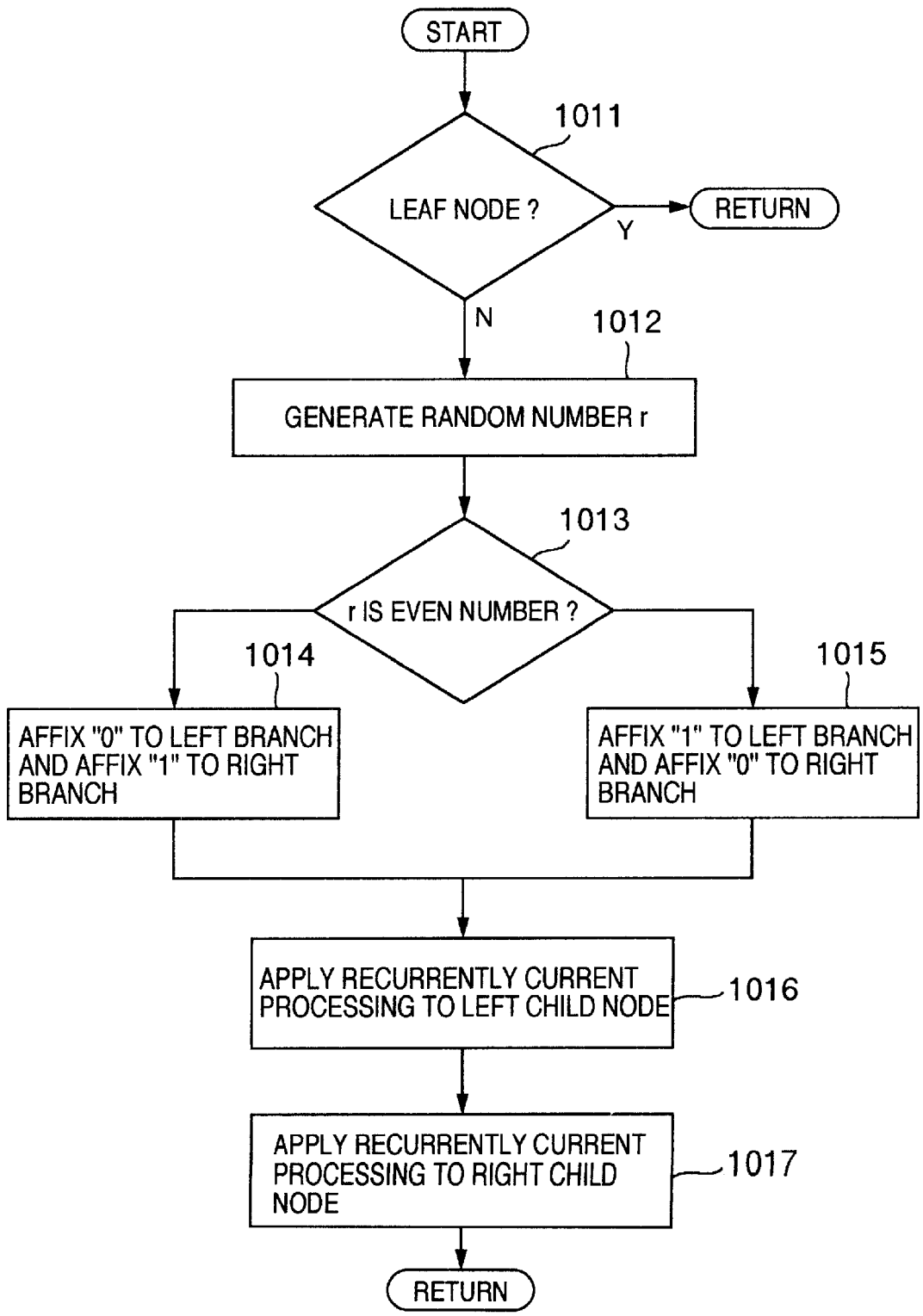
FIG. 4 is a flow chart for illustrating a procedure of establishing correspondences between symbols and bit strings on the basis of random numbers according to the first exemplary embodiment of the present invention.

Next, by referring to FIG. 4, the step 101 shown in FIG. 1 will be elucidated in detail. In the first place, a Huffman tree which is affixed with neither "0" nor "1" is generated in accordance with a conventional Huffman tree generating method such as disclosed in "DATA COMPRESSION HANDBOOK" published by TOPPAN-PUB., pp. 21 to 60. Next, by executing the processing illustrated in FIG. 4 for the root node of the Huffman tree, "0" or "1" is affixed to the branches of the Huffman tree.

In a step 1011, a decision is made as to whether the node of interest is a leaf node or not. If the leaf node is decided, return is made to the start (initially, this is not the case). If otherwise, the processing proceeds to a step 1012 where a random number is generated. In a step 1013, decision is made as to whether the random number as generated is an even or odd number. In case the random number is an even number, the processing proceeds to a step 1014 while it proceeds to a step 1015 when the random number is an odd number. In the step 1014, a left branch of the node of concern is affixed with "0", while a right branch is affixed with "1". In the step 1015, values reverse to those added in the step 1014 are affixed. In a step 1016, the processing now under consideration is applied recurrently to a child node located to the left of the node of concern. In a step 1017, the processing now under discussion is applied recurrently to a child node located to the right of the node of concern.

Figure 5:
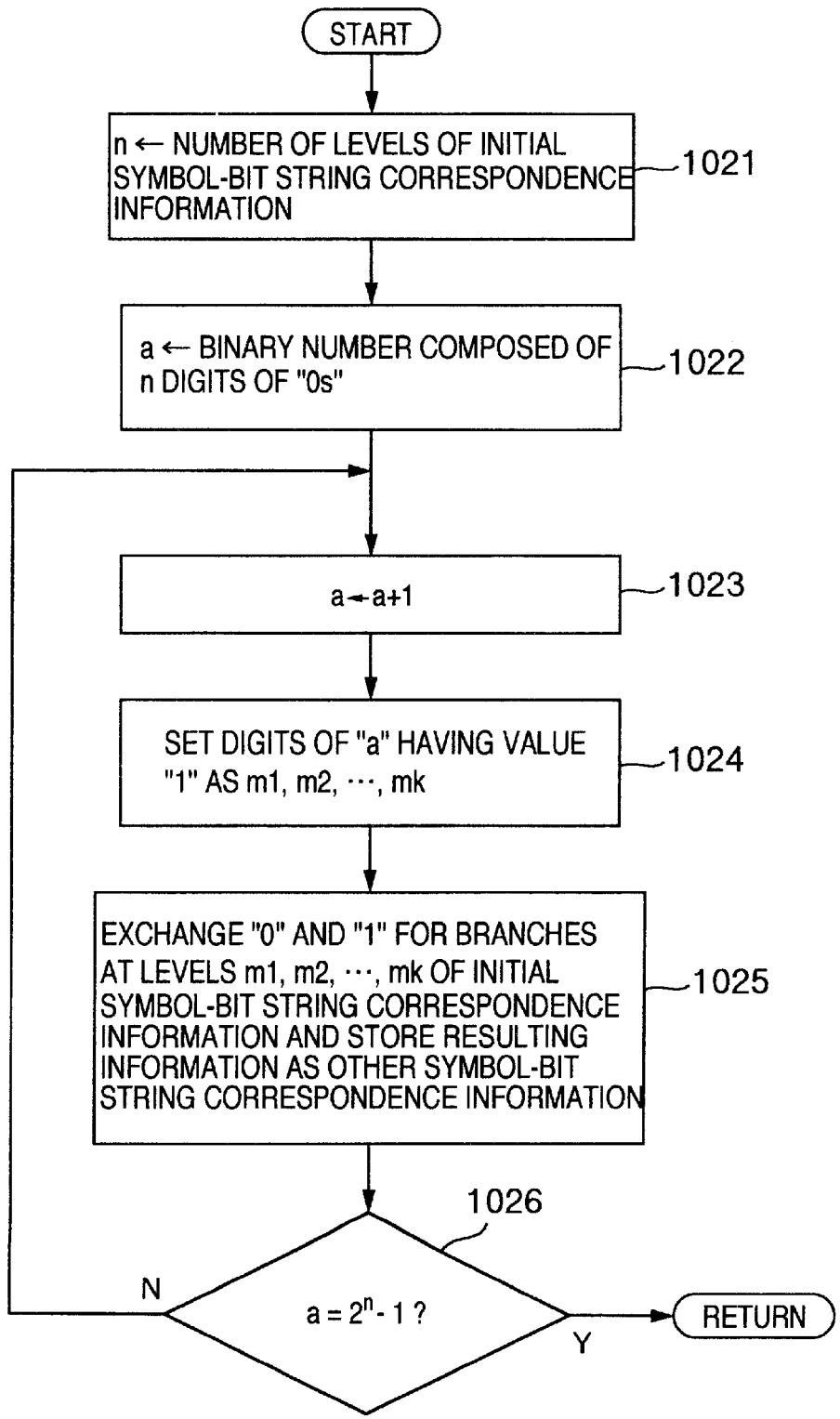
FIG. 5 is a flow chart for illustrating a method of generating plural sorts of correspondence information between symbols and bit strings according to the first exemplary embodiment of the present invention.
Figure 6:
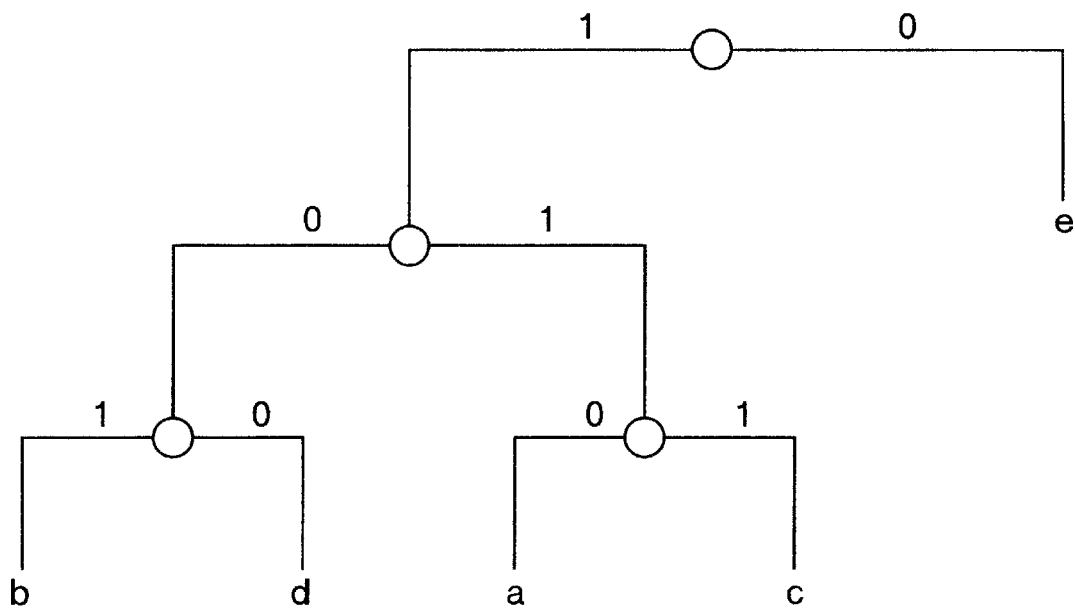
FIG. 6 is a view illustrating an exemplary modification of the symbol-bit string correspondence information shown in FIG. 3.

Next, by referring to FIG. 5, the step 102 shown in FIG. 1 will be elucidated in detail. In a step 1021, the number of levels of the initial symbol-bit string correspondence information determined by the method described previously by reference to FIG. 4 is substituted for a variable n. For example, in the case of the Huffman tree shown in FIG. 3, n=3. In a step 1022, a binary number composed of n digits of "0s" is substituted for a. In a step 1023, the value of a is incremented by one.

Figure 3:
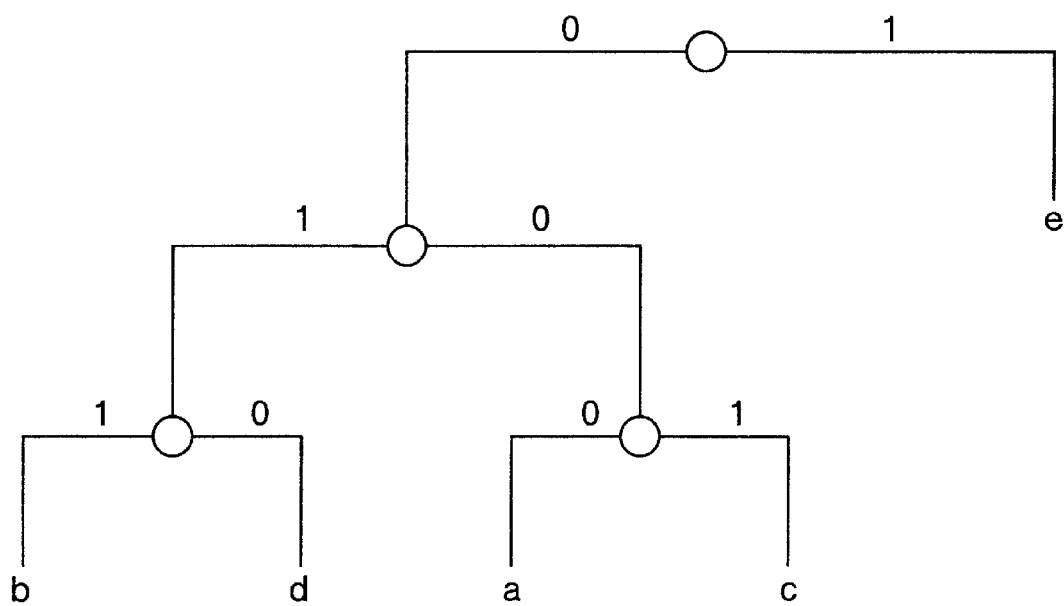
FIG. 3 is a view illustrating, by way of example, a symbol-bit string correspondence information in Huffman coding (Huffman tree)

In a step 1024, the digits of a having the value "1" are determined to be defined as m1, m2, . . . , mk. By way of example, when a is "011", the digits the value of which is "1" are the first and second digits (as counted from the right end). In a step 1025, "0" and "1" are exchanged for the branches at levels m1, m2, . . . , mk of the initial symbol-bit string correspondence information, whereon the symbol-bit string correspondence information is set as other symbol-bit string correspondence information. In the case of the initial symbol-bit string correspondence information in which a is "011" in the Huffman tree illustrated in FIG. 3, a Huffman tree (shown in FIG. 6) resulting from the exchange of "0" and "1" for the branches of first and second levels shown in FIG. 3 is set as the other symbol-bit string correspondence information.

In a step 1026, a decision is made as to whether a=$2^n$−1 or not. If so, return is made to the start and if otherwise, the step 1023 is resumed. Through this processing, there are generated $2^n$−1 sorts of symbol-bit string correspondence information and thus in combination with the initial symbol-bit string correspondence information there are established $2^n$ sorts of correspondences.

Figure 7:
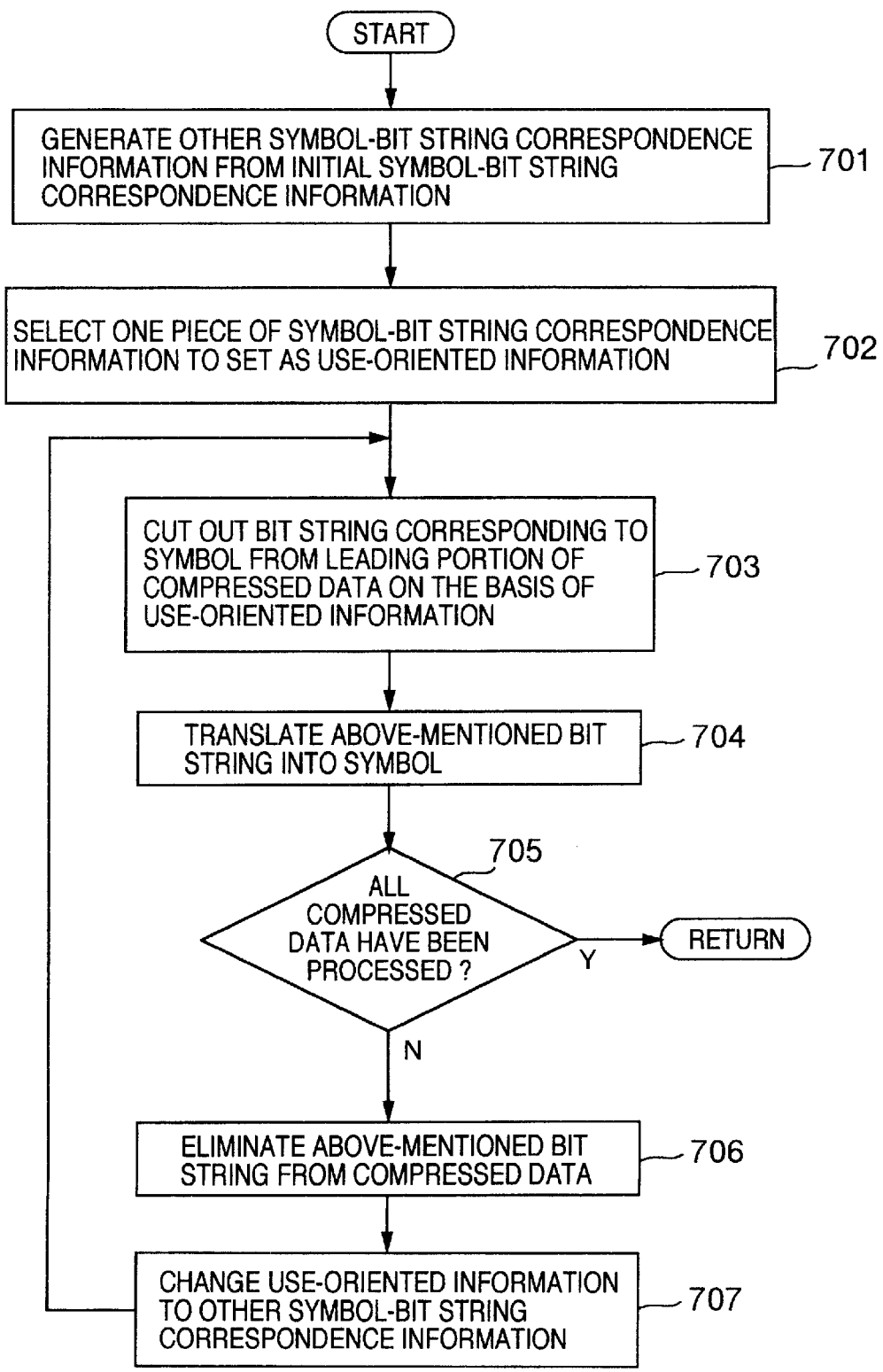
FIG. 7 is a flow chart for illustrating a method for decompression processing according to the first exemplary embodiment of the present invention.

Next, by referring to FIG. 7, the decryption processing 220 shown in FIG. 2 will be elucidated in detail. In a step 701, the other symbol-bit string correspondence information is generated from the initial symbol-bit string correspondence information. To this end, same processing as that of the step 102 shown in FIG. 1 is made use of. When the initial symbol-bit string correspondence information is equal to the initial symbol-bit string correspondence information in the compression processing 206, this means that all the symbol-bit string correspondence information is equal to the symbol-bit string correspondence information in the compression processing.

In a step 702, one piece of the symbol-bit string correspondence information is selected as the use-oriented information. To this end, same processing as that in the compression processing step 103 is employed as well. Thus, the same use-oriented information as in the compression processing is selected. In a step 703, the bit string corresponding to the symbol is cut out from the leading portion of the compressed data on the basis of the use-oriented information. In a step 704, the above-mentioned bit string is translated into the symbol to thereby determine the original raw data.

In a step 705, a decision is made as to whether or not all the compressed data have been processed. If all the compressed data have been processed, return is made to the start. If otherwise, the processing proceeds to a step 706 where the bit string as processed is eliminated from the compressed data. In a step 707, the use-oriented information is changed to the other symbol-bit string correspondence information, whereupon the step 703 is resumed. To this end, there is employed the same processing as that in the step 108 shown in FIG. 1. Consequently, the same use-oriented information as that in the compression processing is selected.

In the following, description will be made of how actual data can undergo compression and encryption in accordance with the teachings incarnated in the instant exemplary embodiment by reference to FIG. 11 to FIG. 18. In actual applications, a large amount of data is to be compressed and encrypted. For simplification of description, however, "this theater" will be taken as an example of the raw data in this case. At first, through the input/output processing 203, this data is inputted to be stored in the secondary storage 211. Subsequently, upon reception of the compression/encryption command by the input/output processing 203, the data is transferred to the control processing 204 from the input/output processing 203. In principle, the raw data is not processed at one time but partitioned into quantities capable of undergoing the processings internally of the main storage of the information processing system 201. However, because the amount of the raw data is small in this case, it is presumed that the raw data is processed at one time.

The control processing 204 activates the probability information generation processing 205 to determine the occurrence probability of the symbols in the raw data, the result of which is transferred to the compression processing 206. In the case of the instant example, the total number of the symbols is twelve inclusive of a space intervening between "s" and "t". The occurrence probability, for example, of "t" is 3/12, while the occurrence probability of "h" is 2/12.

Figure 8:
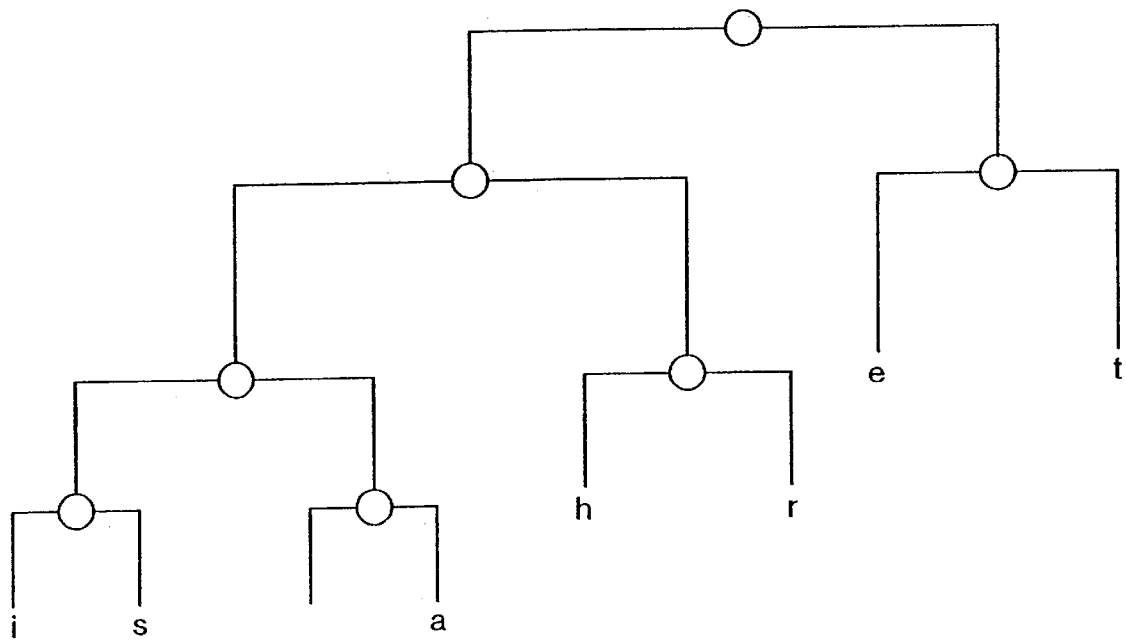
FIG. 8 is a view illustrating, by way of example, an interim result of generation of the symbol-bit string correspondence information (Huffman tree)
Figure 9:
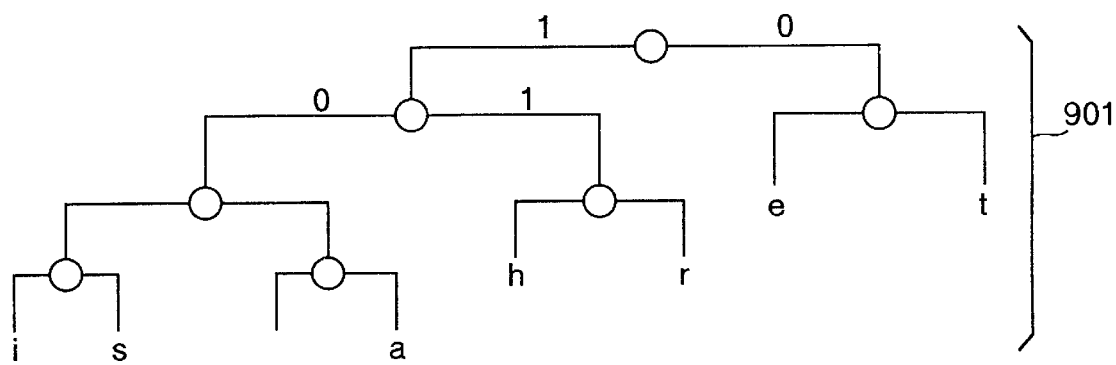
FIG. 9 is a view illustrating, by way of example, an interim result and a final result of generation of the symbol-bit string correspondence information (Huffman tree)
Figure 9:
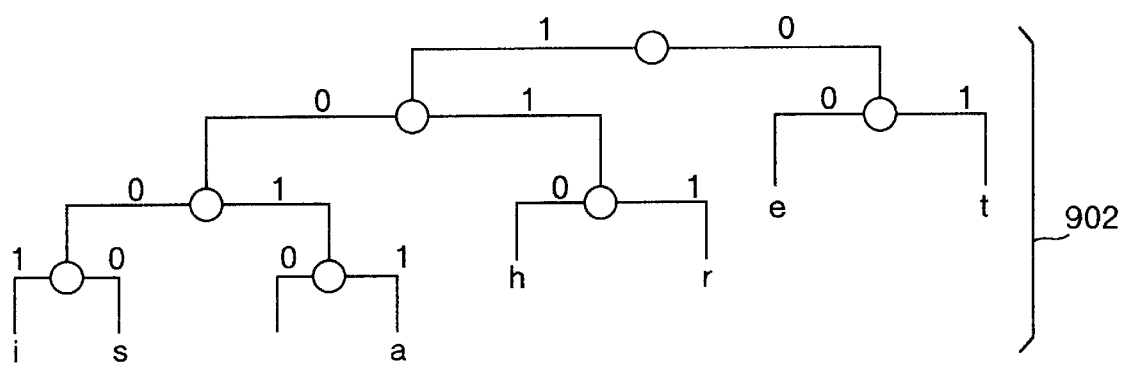

With the compression processing 206, the raw data placed in the secondary storage 211 is compressed on the basis of the symbol occurrence probability information through the processing illustrated in FIG. 1. At first, in the step 101, a Huffman tree which is affixed with neither "0" nor "1" is generated on the basis of the symbol occurrence probability in accordance with a conventional method. In the case of the instant example, a Huffman tree illustrated in FIG. 8 is obtained. Next, by applying the processing shown in FIG. 4 to the root node of the Huffman tree, "0" and "1" are affixed to the branches of the Huffman tree.

In the step 1011, decision is made as to whether or not the node of interest is a leaf node. In this case, negation or "No" is resulted because the node of concern is the root node. In the step 1012, a random number r is generated. It is assumed that the random number r is equal to "649023" by way of example. In the step 1013, decision is made as to whether the random number r is an even number or not. In this case, the answer is negative or "No". In the step 1015, a left branch of the node of concern is affixed with "1", while a right branch is affixed with "0".

In a step 1016, the processing now under consideration is applied recurrently to a child node located left to the node of concern. The step 1011 results in negation or "No" for the left child node. In the step 1012, it is presumed that the random number r becomes equal to "89024". The step 1013 will then result in affirmation "Yes". In a step 1014, a left branch of the node of concern is affixed with "0", while a right branch is affixed with "1". The Huffman tree at this level is illustrated at a block 901 in FIG. 9.

Next, in the step 1016, the processing now under consideration is applied again to a child node located to the left of the node of concern. It is assumed that by repeating similar processing, the Huffman tree shown at a block 902 is obtained. This tree represents the initial symbol-bit string correspondence information.

In the step 102, the other symbol-bit string correspondence information is generated from the initial symbol-bit string correspondence information at the block 902 through the processing illustrated in FIG. 5. In the step 1021, the number of levels of the Huffman tree illustrated at the block 902 is determined and substituted for the variable n. In the case of the Huffman tree now under consideration, n=4. In the step 1022, a binary number "0000" composed of 4 digits of "0s" is substituted for the variable a. In the step 1023, "0001" is substituted for the variable a. In the step 1024, the digits of a having the value "1" are determined. In the case of the instant example, "1" is found at the first digit. In the step 1025, "0" and "1" are exchanged for the branches at the first level in the block 902, the result of which is stored as the other symbol-bit string correspondence information. In the case of the instant example, a block 1001 shown in FIG. 10 is stored.

In the step 1026, decision is made as to whether $a=2^4-1$ or not. In the case of the instant example, the decision results in negation "No". In the step 1023, "0010" is substituted for a. In the step 1024, it is determined that the digit of a having the value "1" is the second digit. In the step 1025, the values of the branches at the second level in the block 902 are changed to obtain a block 1002. Similarly, through the succeeding loop, the branches of the first and second levels are changed to obtain a block 1003. By repeating the similar processings, 15 ($=2^4-1$) pieces of the symbol-bit string correspondence information are determined, whereby 16 sorts of the symbol-bit string correspondence information inclusive of the initial symbol-bit string correspondence information are made available.

In the block 103, one information is selected from 16 sorts of the symbol-bit string correspondence information mentioned above and defined as the use-oriented information. In this case, it is assumed that the initial symbol-bit string correspondence information, i.e., the block 902 is selected. In the block 104, the leading symbol of the raw data is defined as the current symbol. In the case of the instant example, "t" is the current symbol. In the block 105, "t" is translated into a corresponding bit string on the basis of the use oriented information. In the case of the instant example, "t" is translated into "01". In the step 106, decision is made as to whether or not the whole raw data have been processed. At this time point, however, the step 106 results in negation or "No". Accordingly, the processing proceeds to the block 107 where the succeeding symbol is set as the current symbol. In the case of the instant example, "h" represents the current symbol.

In the block 108, the use-oriented information is changed to the other symbol-bit string correspondence information in accordance with the method described previously. The current use-oriented information is the initial symbol-bit string correspondence information, i.e., zero-th symbol-bit string correspondence information. When the bit string "01" corresponding to "t" as mentioned above is regarded as a binary number, the value thereof is "1". Accordingly, "1" is added to the identification number of the current symbol-bit string correspondence information, whereon the first symbol-bit string correspondence information is set as new use-oriented information. This corresponds to a Huffman tree shown at the block 1001.

Subsequently, the current symbol "h" is translated into a corresponding bit string "010" on basis of the use-oriented information. The decision block 106 results in negation "No". In the block 107, "i" is set as the current symbol. In the step 108, the third symbol-bit string correspondence information is set as the use-oriented information because the current use-oriented information is the first symbol-bit string correspondence information and because the bit string "010" corresponding to "h" represents the numerical value "2". In succession, through the similar processings, the raw data are translated into compressed data.

FIG. 11 shows the compressed data, wherein the bit string following the third symbol inclusive is omitted.

Next, through the encryption processing 207, the above-mentioned compressed data undergoes further encryption by a conventional encryption method, whereon the encrypted data as obtained are stored in the secondary storage 211. Additionally, the initial symbol-bit string correspondence information is encrypted and stored in the secondary storage 211.

In succession, a transmission command is inputted through the input/output processing 203 to be transferred to the control processing 204. In response, the control processing 204 activates the transmission processing 208 for sending the compressed/encrypted data and the initial symbol-bit string correspondence information as encrypted to the information processing system 215.

Upon reception of the compressed/encrypted data and the encrypted initial symbol-bit string correspondence information mentioned above, the reception processing 219 stores these data in the secondary storage 224. Upon inputting of the decoding/reconstitution command, the input/output processing 217 transfers the command to the control processing 218. The control processing 218 then activates the decryption processing 220 and the decompression processing 221 to thereby carry out the decryption and decompression of the compressed/encrypted data. In principle, the compressed/encrypted data is not processed at a time but partitioned so as not to exceed the capacity of the memory incorporated in the information processing system 215 in processing the data. However, in the case of the instant example, the processing is performed at one time because of a small amount of the data.

In the decryption processing 220, the encrypted initial symbol-bit string correspondence information is decrypted in accordance with the conventional decryption method, the result of which, i.e., block 902, is stored in the main storage 222. Additionally, the compressed/encrypted data is decrypted to the data as it was before the aforementioned encryption processing 207, i.e., the compressed data shown in FIG. 11 to be subsequently transferred to the decompression processing 221.

The decompression processing 221 decompresses the compressed data illustrated in FIG. 11 on the basis of the initial symbol-bit string correspondence information stored in the main storage by the processing illustrated in FIG. 7. In the step 701, other symbol-bit string correspondence information is generated from the initial symbol-bit string correspondence information shown at the block 902 through the same processing as that in the step 102. In the step 702, one piece of the symbol-bit string correspondence information is selected as the use-oriented information through the same processing as that in the step 103. In the case of the instant example, the initial symbol-bit string correspondence information (block 902) is selected.

In the step 703, "01" is cut out from the leading portion of the compressed data illustrated in FIG. 11 on the basis of the use-oriented information. In the step 704, "01" is translated into "t". The answer of the step 705 is negative "No". In the step 706, "01" is eliminated from the leading portion of the compressed data shown in FIG. 11. In the step 707, the second symbol-bit string correspondence information is set as new use-oriented information through the same processing as that in the step 108. In succession, through the similar processings, the compressed data is translated or restored to the raw data, which is then stored in the secondary storage 224.

Finally, the input/output processing 217 responds to reception of an output command to thereby output the raw data stored in the secondary storage 224.

As is apparent from the foregoing, according to the instant embodiment, the raw data can be compressed and encrypted while the compressed/encrypted data can be decrypted and decompressed for restoring the original raw data.

Because the amount of the data which are to undergo the compression/encryption at one time as well as the decryption/decompression at one time are so set that the memory capacity required for the compression/encryption processings and decryption/decompression processings of the data does not exceed the capacity of the main storage incorporated in the information processing system, the compression/encryption processings as well as the decryption/decompression processings can be performed internally of the main storage, whereby write operation of the interim results to the secondary storage is rendered unnecessary, which in turn means that improvement of the efficiency and reduction of the power consumption can be achieved.

In the encryption processing according to the conventional compression/encryption method, the encryption processing is applied to the compressed data and the symbol-bit string correspondence information. By contrast, according to the instant embodiment, encryption of the raw data is realized by (1) generating the symbol-bit string correspondence information on the basis of random number, (2) changing the symbol-bit string correspondence information, (3) applying the encryption processing to the symbol-bit string correspondence information, and (4) applying the encryption processing to the compressed data.

In the processing (1), "0" and/or "1" are affixed to the branches of the Huffman tree. In this conjunction, the Huffman tree has the leaf nodes in a number equal to the number of different symbols, wherein the number of branches is given by (number of different symbols $-1$)$\times 2$. Because the number of the different symbols is on the order of 300 at the most, the processing (1) is only required to affix "0" or "1" to the branches on the order of 600 at the most, which thus can be executed within a negligibly short time when compared with the conventional processing for applying the complicated encryption to the compressed data of several kilo to several mega bytes. Similarly, the time taken for the processing (2) is negligibly short. With regards to the processing (3), the symbol-bit string correspondence information is of an extremely small amount when compared with the compressed data. Accordingly, the time required for the encryption of the symbol-bit string correspondence information is also negligibly short. The encryption processing (4) can be realized satisfactory by resorting to simple schema for the reasons described below.
(a) The raw data has already been encrypted through the processings (1) to (3) mentioned above.
(b) Through the processing (1), the correspondence is set between the symbol and the bit string on the basis of the random number. Consequently, correspondence between the symbol and the bit string becomes utterly different every time the encryption processing now concerned is activated even when the raw data are similar or same. Furthermore, because the correspondence between the symbol and the bit string is changed in the course of the processing due to the feature (2), any repetitive pattern contained in the raw data can not make appearance in the raw data. To say in another way, measures for coping with the cryptanalysis such as comparison of the similar data, analysis of repeated patterns and other have already been taken.

For the reasons mentioned above, the time for the encryption processing (4) can be shortened when compared with the conventional encryption processing. It will now be apparent that the time required for the compression/encryption can be shortened according to the invention incarnated in the instant embodiment.

On the other hand, in the decryption processing according to the conventional decryption/decompression method, the decryption processing is applied not only to the compressed/encrypted data but also to the encrypted symbol-bit string correspondence information. By contrast, according to the invention incarnated in the instant embodiment, the compressed/encrypted data is decrypted by (1) applying the decryption processing to the symbol-bit string correspondence information, (2) changing the symbol-bit string correspondence information and (3) applying the decryption processing to the compressed/encrypted data.

Of the processings mentioned above, the time taken for the processings (1) and (2) is negligibly short as in the case of the encryption processing. In general, in the case where the encryption processing is simple, the decryption processing is simple as well. Consequently, the time required for the decryption processing (3) is short as compared with the conventional decryption processing. For these reasons, the time taken for the decryption/decompression processings can be shortened according to the instant embodiment.

Next, a second exemplary embodiment of the present invention will be described by referring to FIG. 12 to FIG. 14. The second exemplary embodiment is a modification of the first exemplary embodiment described above. In the case of the first exemplary embodiment described so far, the symbols are translated into the bit strings by using plural sorts of symbol-bit string correspondence information through the processings mentioned below with a view to concealing the repetitive patterns in the raw data.
(1) When representing by n the level number of the initial symbol-bit string correspondence information (initial Huffman tree), $2^n$ sorts of symbol-bit string correspondence information are generated in the step 102 shown in FIG. 1.
(2) When the bit string determined from the immediately preceding symbol is regarded as a numeral having a value v while the identification number of the symbol-bit string correspondence information being currently used is represented by w with the total number of the symbol-bit string correspondence information being represented by L, the remainder resulting from division of (v+w) by L is allocated as the identification number for the symbol-bit string correspondence information to be next used in the step 108.

According to the instant exemplary embodiment, concealment of the repetitive pattern can be accomplished more completely by adopting the method described below.
(a) In conjunction with the above-mentioned processing (1), a greater number of symbol-bit string correspondence information are generated in the step 102.
(b) In conjunction with the above-mentioned processing (2), plural sorts of expressions are prepared in advance for determining the identification number of the symbol-bit string correspondence information to be next used, wherein in the step 108, the identification number of the symbol-bit string correspondence information to be next used is determined in accordance with one of the above-mentioned expressions. To this end, a common parameter which is private except for the sender and the receiver of the data is set for the compression processing 206 and the decompression processing 221 for making it possible to determine selectively the one expression to be used on the basis of the above-mentioned parameter.

Figure 12:
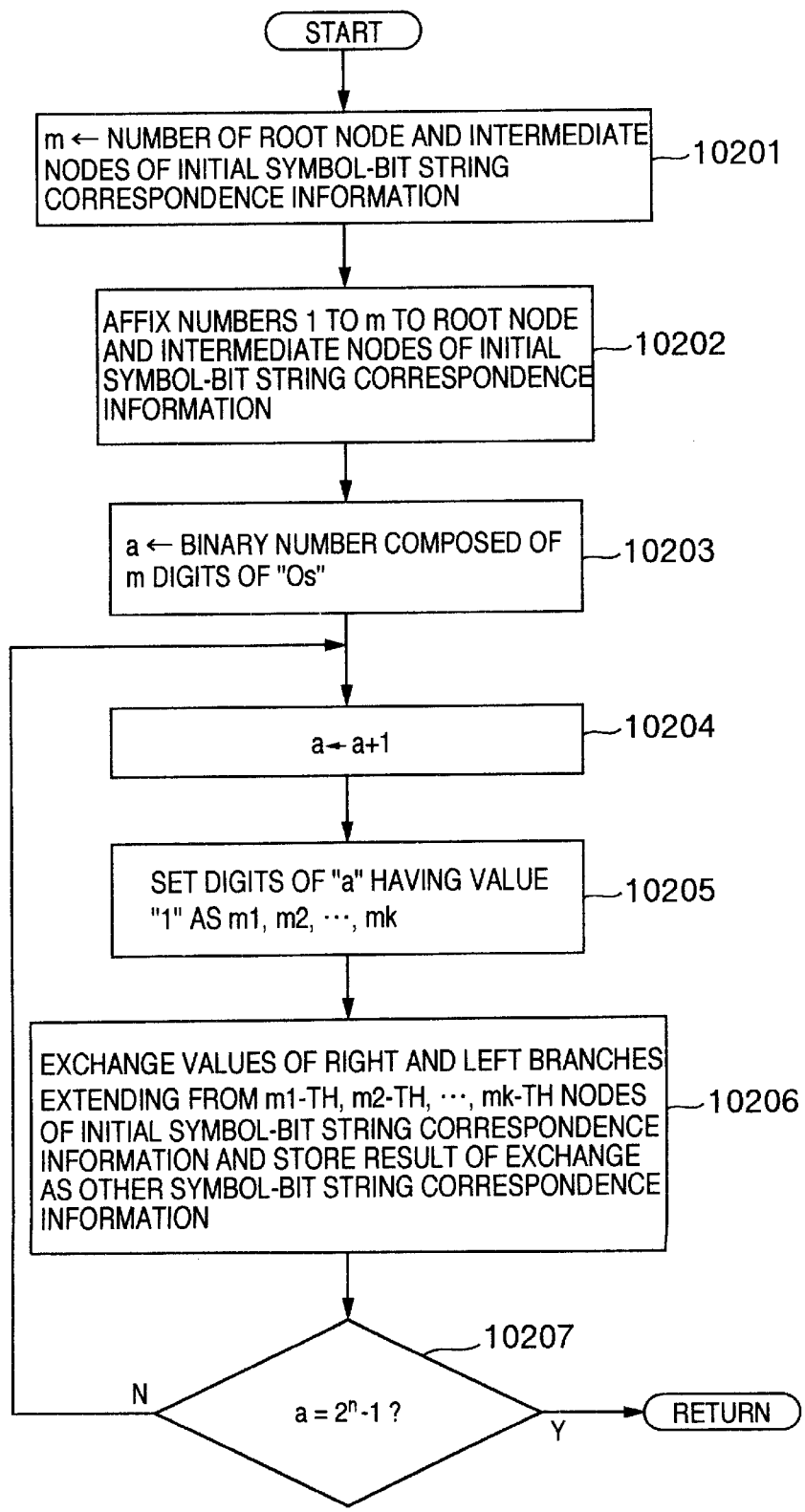
FIG. 12 is a flow chart for illustrating a method of generating plural sorts of symbol-bit string correspondence information according to a second exemplary embodiment of the present invention.
Figure 13:
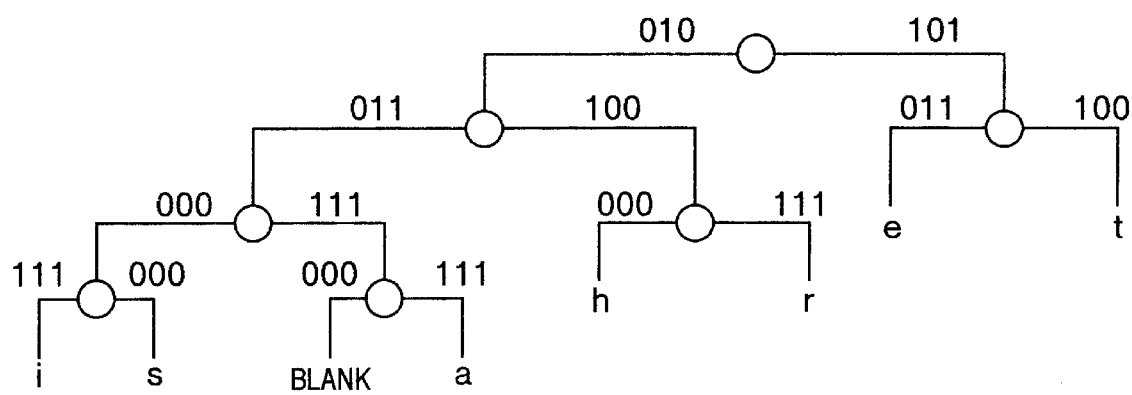
FIG. 13 is a view illustrating a data format for storing plural sorts of symbol-bit string correspondence information according to the second exemplary embodiment of the present invention.

The above-mentioned feature (a) can be realized by resorting to a method illustrated in FIG. 12 in place of the method shown in FIG. 5 as adopted in the first exemplary embodiment for executing the processing step 102. In a step 10201, the number of the root node and the intermediate nodes of the initial symbol-bit string correspondence information is placed in a variable m. In a step 10202, identification numbers 1 to m are affixed to the root node and the intermediate nodes of the initial symbol-bit string correspondence information. In a step 10203, a binary number composed of m digits of "0s" is placed in a variable a. In a step 10204, a is incremented by one. In a step 10205, the digits of a having the value "1" are determined and represented by m1, m2, . . . , mk, respectively.

In a step 10206, values ("0" or "1") of right and left branches spreading from the m1-th, m2-th, . . . , mk-th nodes of the initial symbol-bit string correspondence information are exchanged, whereon the symbol-bit string correspondence information as resulted is set as the other symbol-bit string correspondence information (the initial symbol-bit string correspondence information is a binary tree, wherein two branches are spread from the root node and the intermediate nodes, respectively). In a step 10207, a decision is made as to whether ($a=2^{m-1}$) applies valid or not. If so, return is made to the start while if otherwise, the step 10204 is resumed.

Through the above-mentioned processing, there are obtained $2^{m}-1$ sorts of symbol-bit string correspondence information inclusive of the initial symbol-bit string correspondence information. Obviously, the number of the symbol-bit string correspondence information as obtained in this way is greater than $2^n$ symbol-bit string correspondence information obtained in the first exemplary embodiment. By way of example, let's consider the initial symbol-bit string correspondence information illustrated in FIG. 3. In this case, it applies valid that m=4 and n=3. Accordingly, in the case of the instant exemplary embodiment, there are obtained sixteen sorts of symbol-bit string correspondence information while in the case of the first exemplary embodiment, the number of the symbol-bit string correspondence information is eight. Furthermore, in the case of the initial symbol-bit string correspondence information illustrated in FIG. 8, m=7 and n=4. Accordingly, the number of the available symbol-bit string correspondence information is one hundred and twenty eight in the case of the instant exemplary embodiment, while the number of the symbol-bit string correspondence information obtained in the case of the first exemplary embodiment is sixteen.

When a large number of the symbol-bit string correspondence information pieces are to be stored individually and discretely, a memory of very large capacity will be required. For this reason, the memory occupation is reduced by the method mentioned below. Plural pieces of symbol-bit string correspondence information for the same raw data are same in respect to the structure of the binary tree and differ from one another only in respect to the values "0" or "1" affixed to the branches of the tree. Accordingly, the plural pieces of symbol-bit string correspondence information may be represented by one binary tree with a plurality of values being affixed to the individual branches, respectively. By way of example, three binary trees illustrated in FIG. 10 may be synthetically represented in such a form as illustrated in FIG. 13.

Figure 14:
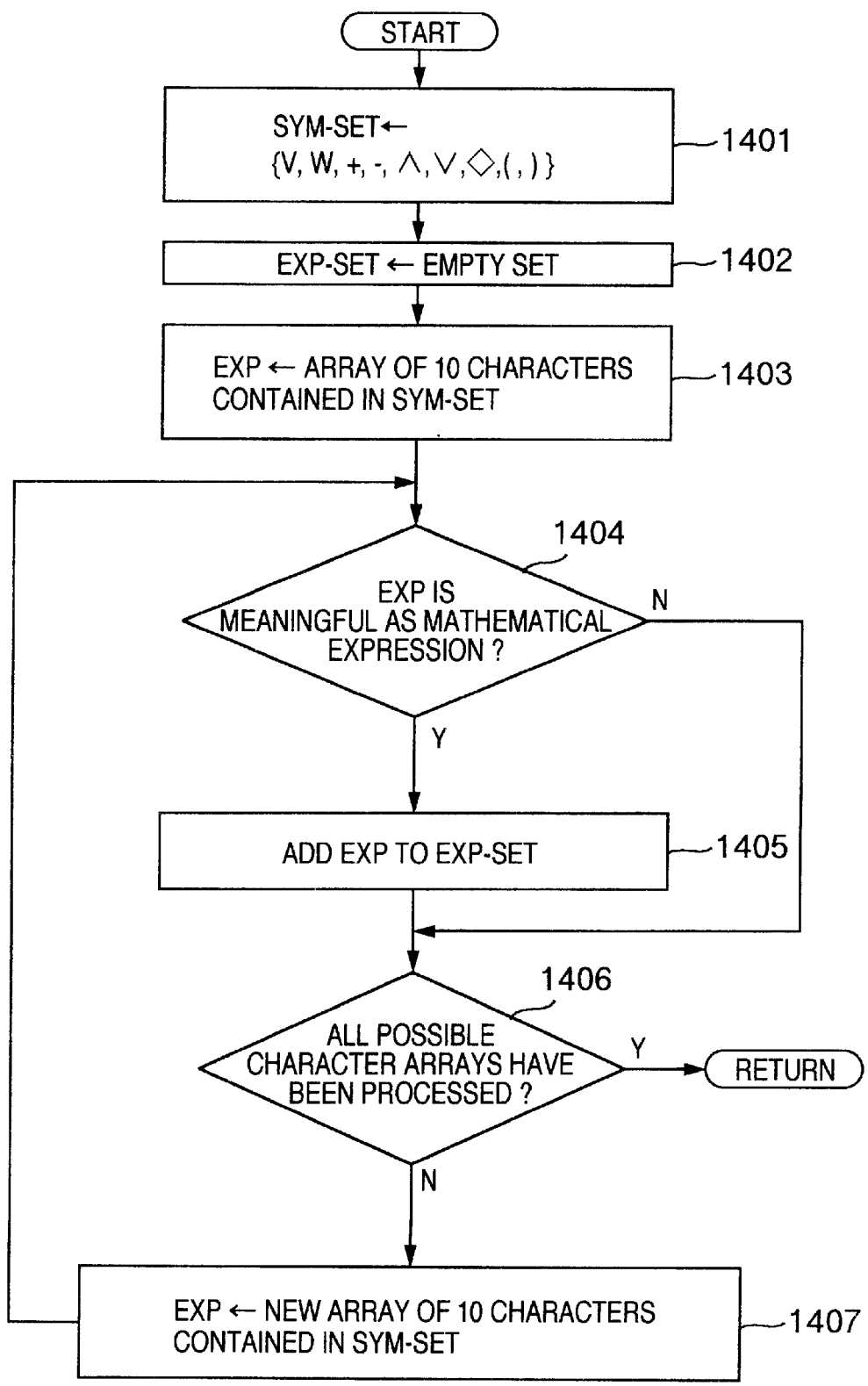
FIG. 14 is a flow chart for illustrating a method of generating plural sorts of expressions for changing over the symbol-bit string correspondence information according to the second exemplary embodiment of the present invention.

Next, referring to FIG. 14, a description will be directed to a method of determining plural sorts of expressions in conjunction with the processing (b) mentioned previously. At this juncture, it is assumed that plural sorts of expressions each composed of ten characters whose values are computed from "v" and "w" mentioned previously are to be determined. In a step 1401, a set of nine characters "v", "w", "+", "−", "∧", "∨", "◇", "(" and ")" are placed in a variable "SYM-SET" (where "+" and "−" represent addition and subtraction, respectively, by regarding "v" and "w" as numerical values, "∧", "∨" and "◇" represent logical AND, logical OR and exclusive OR when "v" and "w" are regarded as bit strings, respectively, and "(" and ")" represent parentheses for indicating the order of computations). In a step 1402, an empty set is placed in EXP-SET. In a step 1403, an array of 10 characters contained in SYM-SET (same character may be used twice) is determined and placed in a variable EXP.

In a step 1404, it is decided whether or not EXP is meaningful as the mathematical expression, which may be done by resorting to a syntax analysis technique such as described in "COMPILER" published by SANGYO TOSHO, ltd., (1981) pp. 41–140. When it is decided to be meaningful, the processing proceeds to a step 1405 and EXP is added to EXP-SET. If otherwise, the processing proceeds to a step 1406.

In a step 1406, it is decided whether or not the processing has been completed for all the arrays of ten characters which can be generated from the SYM-SET. If so, return is validated. If otherwise, the processing proceeds to a step 1407. In the step 1407, a new array of ten characters contained in SYM-SET is placed in EXP, whereon the step 1404 is resumed.

By virtue of the arrangement according to the second exemplary embodiment described above, the correspondence between the symbol and the bit strings becomes very diverse, whereby the repetitive patterns contained in the raw data can be completely obscured. As a result of this, encryption of a greater immunity degree can be realized.

Next, a third exemplary embodiment of the present invention will be described by referring to FIG. 15 to FIG. 18. The third exemplary embodiment is directed to concrete examples of the sixth and seventh methods mentioned hereinbefore according to which the compression/encryption processings are repetitionally executed for an amount of data which does not exceed the capacity of a main storage of an information processing system of concern. The compression/encryption processings now under consideration reside in an encryption processing combined with an adaptive Huffman compression which is a typical compression procedure based on an adaptive statistical model.

Before entering into description of the instant exemplary embodiment, the adaptive Huffman coding will be briefly reviewed. According to the fixed Huffman coding adopted in the first exemplary embodiment described hereinbefore, the occurrence probability of a symbol is determined by checking the frequency at which the symbol makes appearance in the raw data, whereon correspondence is established between the symbol and a bit string (determination of structure of the Huffman tree), which is then followed by translation of the symbol contained in the raw data into the corresponding bit string. By contrast, according to the adaptive Huffman coding adopted in the instant exemplary embodiment, a predicted value of the occurrence probability of a symbol is employed, wherein the symbol is translated into a bit string through the processing steps mentioned below.

(1) An initial value for the predicted value of the occurrence probability of a symbol is set. By way of example, it is assumed that the occurrence probability of all the symbols is represented by 1/p (where p represents a number of different symbols). On the basis of the predicted value, the initial value for the symbol-bit string correspondence information (Huffman tree) is generated.

(2) A succeeding symbol is fetched from the raw data and translated into a corresponding bit string on the basis of the symbol-bit string correspondence information.

(3) When all the raw data have been processed, the processing now under consideration comes to an end. If otherwise, the predicted value for the occurrence probability of the symbol is updated, which is accompanied with updating of the symbol-bit string correspondence information (change of the Huffman tree in the concrete), whereupon the above-mentioned processing (2) is resumed.

For updating the symbol-bit string correspondence information mentioned above, there may be enumerated various methods. For convenience of the description, however, it is assumed that the undermentioned method is adopted. Namely, the initial values for the occurrence frequencies of individual symbols are all set to be "1". In the processing (3), the frequency of the symbol processed immediately before is incremented by one, whereon the occurrence probability proportional to the frequency is computed to be set as the updated occurrence probability.

Upon decompression, the initial values for the predicted values of the occurrence probability and the modifying method are set to be the same as those adopted in the compression processing, whereon the raw data is restored by carrying out repetitionally the translation of the bit string into the symbol and modification of the predicted value for the occurrence probability.

Figure 15:
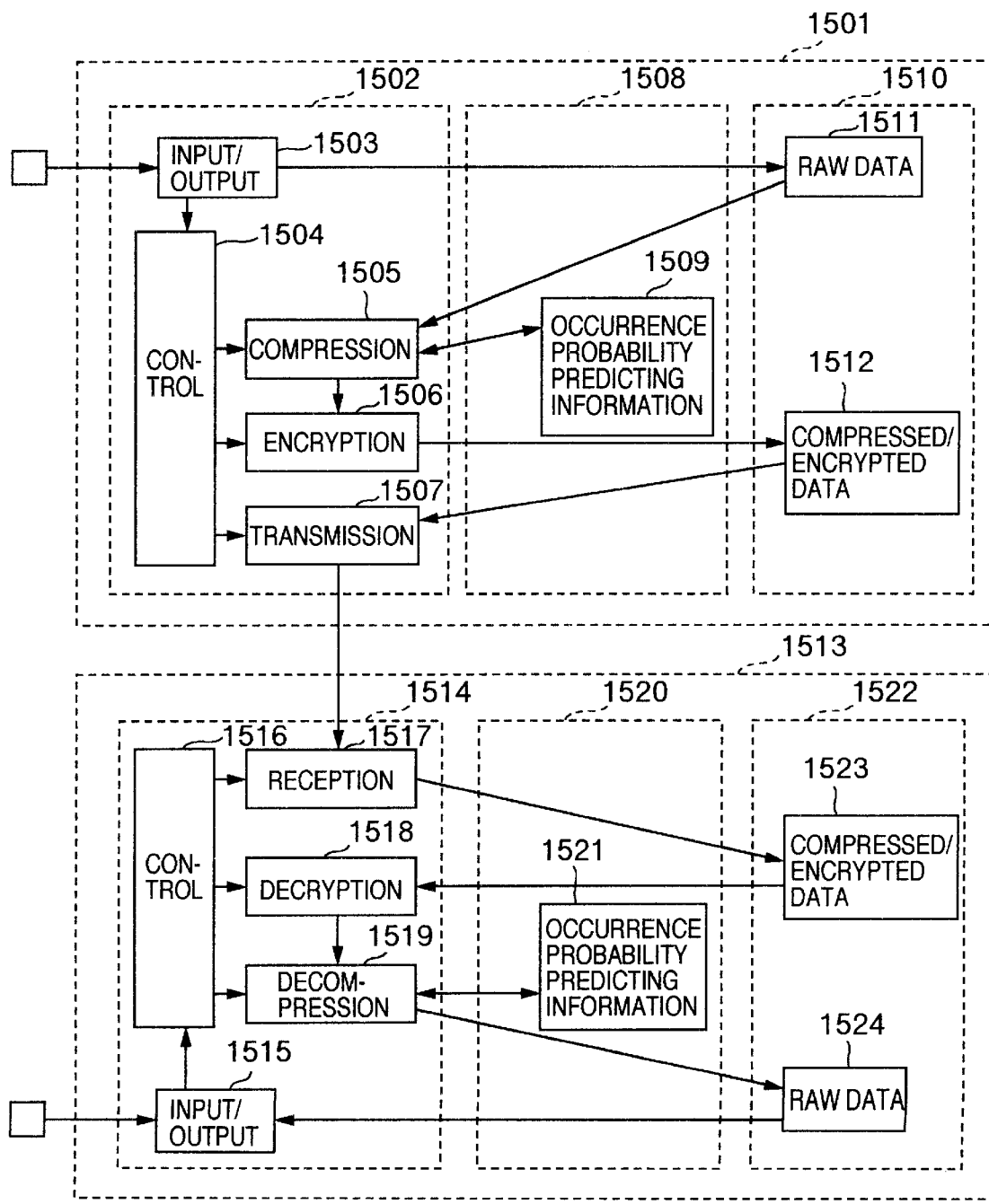
FIG. 15 is a view showing a functional configuration of a third exemplary embodiment of the present invention.

FIG. 15 is a view showing a functional configuration diagram for illustrating the instant exemplary embodiment. Blocks 1501 and 1513 represent completed information processing systems, respectively, wherein data can be sent from the block 1501 to the block 1513 via a communication line.

A block 1502 represents processings which are executed by a central processing unit and I/O units and includes individual processings, i.e., input/output processing 1503, control processing 1504, compression processing 1505, encryption processing 1506 and transmission processing 1507. A block 1508 represents a main storage implemented by a RAM (random access memory) or the like to serve for storage of the occurrence probability information 1509. A block 1510 represents a secondary storage implemented by a hard disk drive or the like to serve for storage of raw data 1511 and compressed/encrypted data 1512.

A block 1514 represents processings which are executed by a central processing unit and I/O units and includes individual processings, i.e., input/output processing 1515, control processing 1516, reception processing 1517, decryption processing 1518 and decompression processing 1519. A block 1520 represents a main storage implemented by a RAM (random access memory) or the like to serve for storage of occurrence probability predicting information 1521. A block 1522 represents a secondary storage implemented by a hard disk drive or the like to serve for storage of compressed/encrypted data 1523 and raw data 1524.

Through the input/output processing 1503, raw data are inputted to be stored in the secondary storage 1510. Further, a compression/encryption command and a data send command are inputted to be transferred to the control processing 1504. Upon reception of the compression/encryption command, the control processing 1504 activates sequentially the compression processing 1505 and the encryption processing 1506 to thereby execute repetitionally the steps of compressing/encrypting a part or portion of the raw data, whereby all the raw data are compressed and encrypted and stored in the secondary storage 1510. In this conjunction, the amount of the raw data undergone the compression/encryption at one time or in one step is so set that the memory capacity required for the compression/encryption processings does not exceed the main storage capacity of the relevant information processing system 1501. Additionally, upon reception of the transmission command for the compressed/encrypted data, the control processing 1504 activates the transmission processing 1507 for causing the compressed/encrypted data to be sent to the information processing system 1513.

Through the compression processing 1505, parts of the raw data 1511 are compressed and encrypted to be transferred to the encryption processing 1506. In the course of this processing, the initial value of the occurrence probability predicting information 1509 is set in the main storage 1508 and updated. This processing will be described later on in more detail by reference to FIG. 16 and FIG. 17.

The encryption processing 1506 as activated receives the compressed data from the compression processing 1505 to encrypt only the designated amount of data from the leading portion of the compressed data, whereon the compressed/encrypted data is stored in the secondary storage 1510. To this end, there may be adopted a conventional symmetric or asymmetric key encryption scheme such as described in "STUDIES OF DATA PROTECTION AND ENCRYPTION" published by Nihon Keizai Shimbun Inc. (1983), pp. 73–153, as in the case of the first exemplary embodiment. Through the transmission processing 1507, the compressed/encrypted data is sent to the information processing system 1513.

Upon inputting of the decrypting/decompressing command, the input/output processing 1515 transfers the command to the control processing 1516. Additionally, the raw data 1524 stored in the secondary storage 1522 is read out. The control processing 1516 then activates sequentially the decryption processing 1518 and the decompression processing 1519 to thereby execute repetitionally the steps of decrypting and decompressing the compressed/encrypted data, whereon the raw data is stored in the secondary storage 1524. In this conjunction, the amount of the compressed/encrypted data undergone the decryption/decompression at one time or in a single step is so set that the memory capacity required for the decryption/decompression processings does not exceed the capacity of the main storage of the relevant system 1513.

Upon reception of the compressed/encrypted data from the transmission processing 1507, the reception processing 1517 stores these data in the secondary storage 1522. In the decryption processing 1518, only the designated amount of data is decrypted from the leading portion of the compressed/encrypted data through translation reverse to that in the encryption processing 1506, whereon the decrypted information is transferred to the decompression processing 1519.

Upon reception of the compressed data from the decryption processing 1518, the decompression processing 1519 decompresses the compressed data, whereby the data is stored in the secondary storage 1522. In the course of this processes, the initial value of the symbol occurrence probability predicting information 1521 is set in the main storage 1520 and updated. This processing will be described in more detail later on by reference to FIG. 18.

Figure 16:
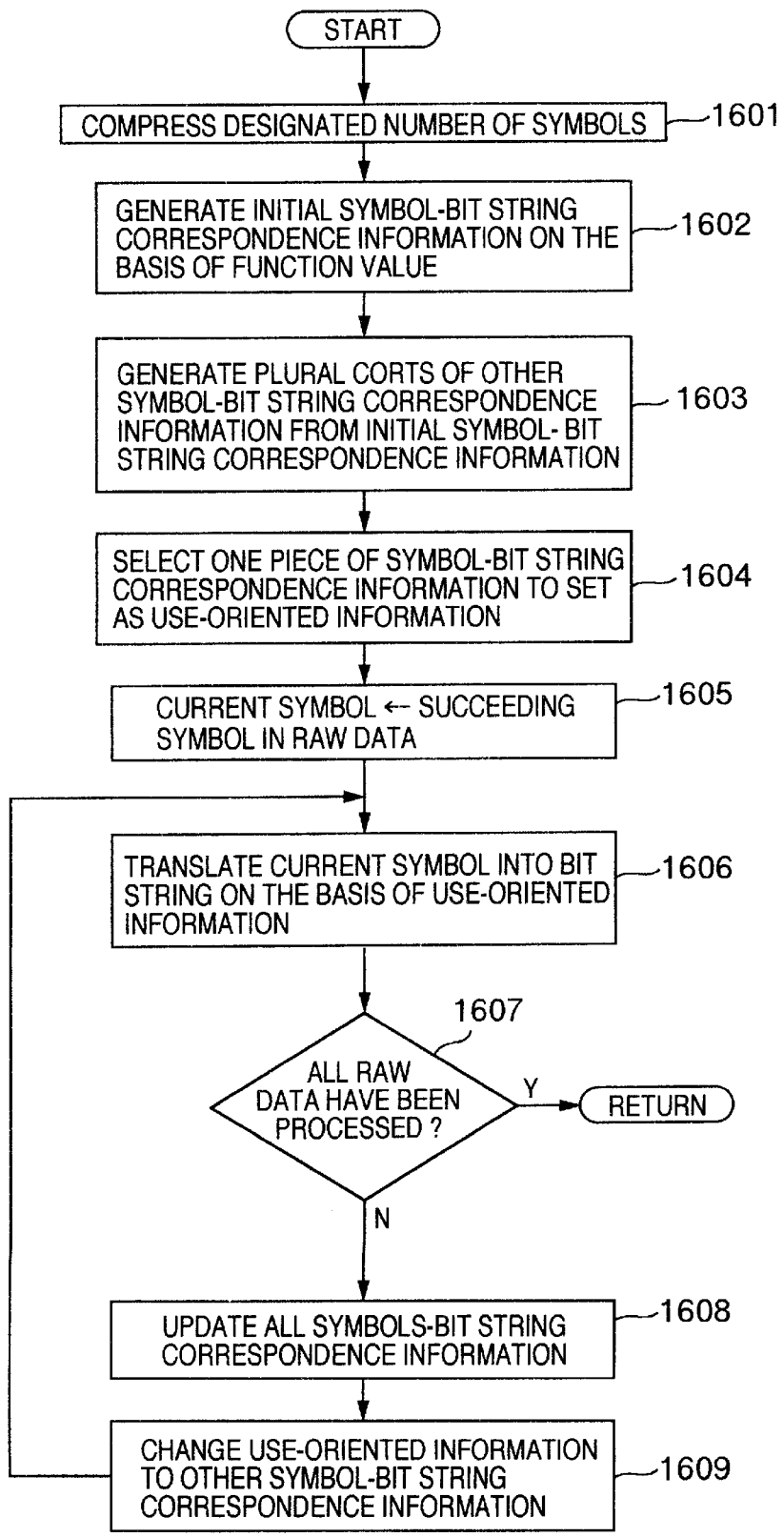
FIG. 16 is a flow chart for illustrating a compression processing method according to the third exemplary embodiment of the present invention.

FIG. 16 shows in detail a method of executing the compression processing 1505. In a step 1601, a designated number of symbols located at the leading portion of the raw data undergo the conventional adaptive Huffman compression. At the time point at which this processing step has been completed, a Huffman tree is generated. In a step 1602, the values "1" and "0" allocated to the branches of the Huffman tree are changed in dependence on a private parameter (referred to as the key) which is common to both the compression processing 1505 and the decompression processing 1519 and the raw data generated till then, whereon the result of the step 1602 is set as the initial symbol-bit string correspondence information (for the succeeding compression/encryption processings). For more particulars of this processing, description will be made in detail later on by reference to FIG. 17.

In a step 1603, other symbol-bit string correspondence information is determined from the initial symbol-bit string correspondence information. The method to this end is similar to that adopted in the processing step 102 described hereinbefore by reference to FIG. 1. A plurality of Huffman trees determined in this way are not stored individually and separately but stored in the form of a single tree structure having branches each affixed with a plurality of values "1" and "0".

In a step 1604, one piece of the symbol-bit string correspondence information is selected to be set as the use-oriented information in accordance with the same method as in the step 103 described previously. In a step 1605, a succeeding symbol of the raw data is defined as the current symbol. In a step 1606, the current symbol is translated into a bit string on the basis of the use-oriented information. In a step 1607, decision is made as to whether or not all the raw data have been processed. If all the raw data has been processed, return is made to the start, while if otherwise, the processing proceeds to a step 1608. In the step 1608, the frequency of the symbol processed immediately before is incremented by one, being accompanied with updating of the occurrence probability predicting information of the individual symbols, whereon all the sorts of the symbol-bit string correspondence information are changed or modified on the basis of the value of the updated predicting information. In the actual computation, the structure of the single Huffman tree representing all the symbol-bit string correspondence information is changed. In a step 1609, the use-oriented information is changed to the other symbol-bit string correspondence information by the processing method similar to that in the step 108.

Figure 17:
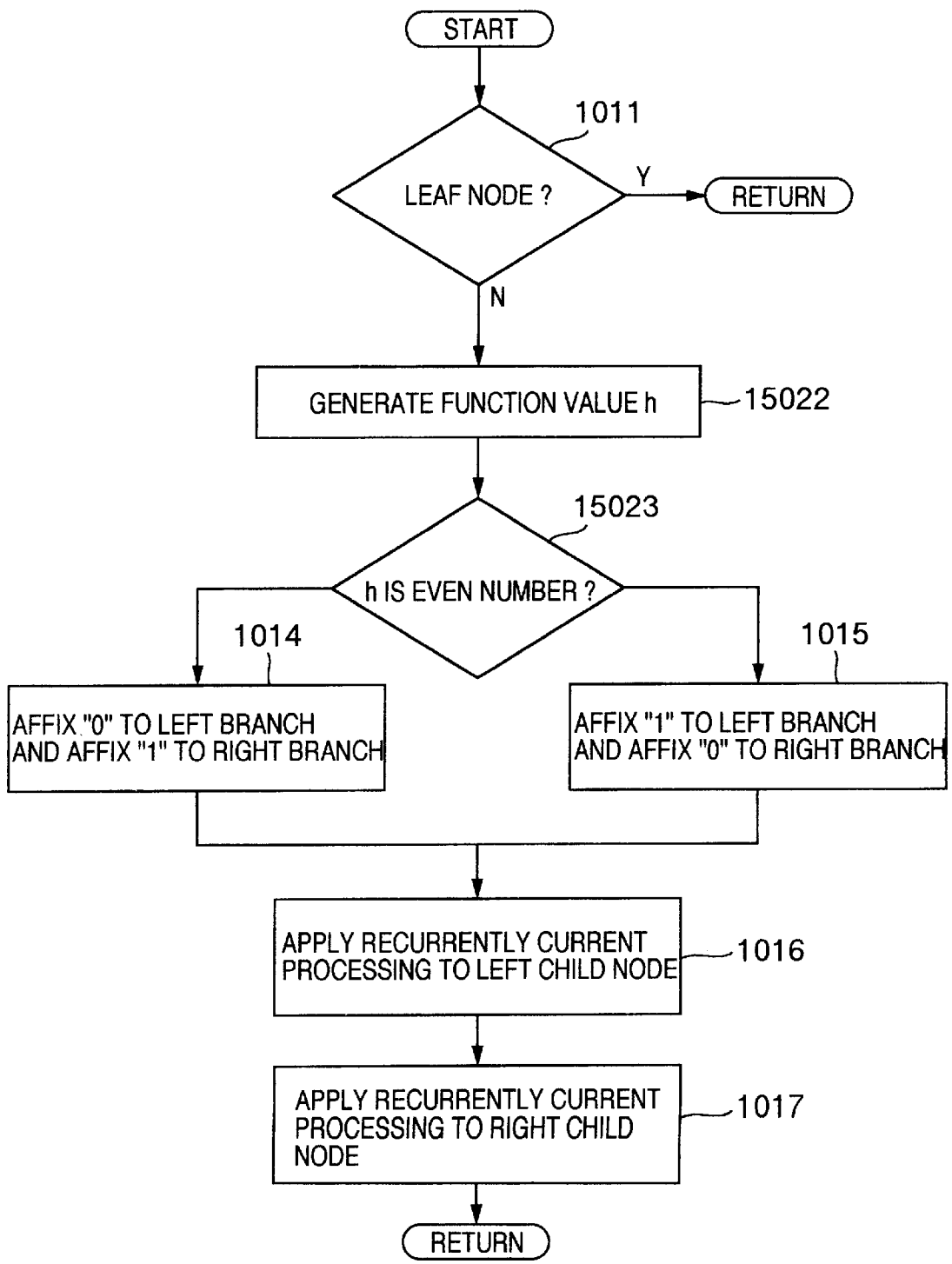
FIG. 17 is a flow chart for illustrating a procedure of establishing correspondences between symbols and bit strings on the basis of function values according to the third exemplary embodiment of the present invention.

Next, a description will be made in detail of generation of the initial symbol-bit string correspondence information in the step 1602 mentioned previously. In the first place, the values "0" and "1" affixed to the branches of the Huffman tree generated until then are deleted, whereon new values are added to the branches of the Huffman tree by applying the processing illustrated in FIG. 17 to the root node of the Huffman tree. The processing illustrated in FIG. 17 is basically identical with the processing shown in FIG. 4 and described hereinbefore in conjunction with the first exemplary embodiment except for only the difference that the values are added to the branches on the basis of the function value h in place of the random number r.

In the step 1011, a decision is made as to whether the node of interest is a leaf node or not. In a step 15022, an integer value h is computed by using a function module f to which a private parameter (key) common to the compression processing 1505 and the decompression processing 1519 and a frequency of the symbol counted until then is inputted and which outputs the integer value changeable in response to any change in the input. Such function can be realized by resorting to a method such as described in IEEE Transaction on Information Theory, Vol. 30, No. 5, pp. 776–780. Owing to the property of the function f mentioned above, if the raw data differs even a little up to the current time point (i.e., even when the frequency of the symbol differs by only one), utterly different symbol-bit string correspondence information is generated. Accordingly, analysis of the encryption by using similar raw data can be prevented.

In a step 15023, decision is made as to whether h is an even or odd number. When h represents is an even number, the processing proceeds to the step 1014 where left and right branches are affixed with "0" and "1", respectively, while when h represents an odd number, the processing proceeds to the step 1015 where values "1" and "0" are affixed to the left and right branches, respectively. In a step 1016, the processing now under discussion is applied recurrently to the left children nodes. In a step 1017, the processing now under discussion is applied recurrently to the right children nodes.

Figure 18:
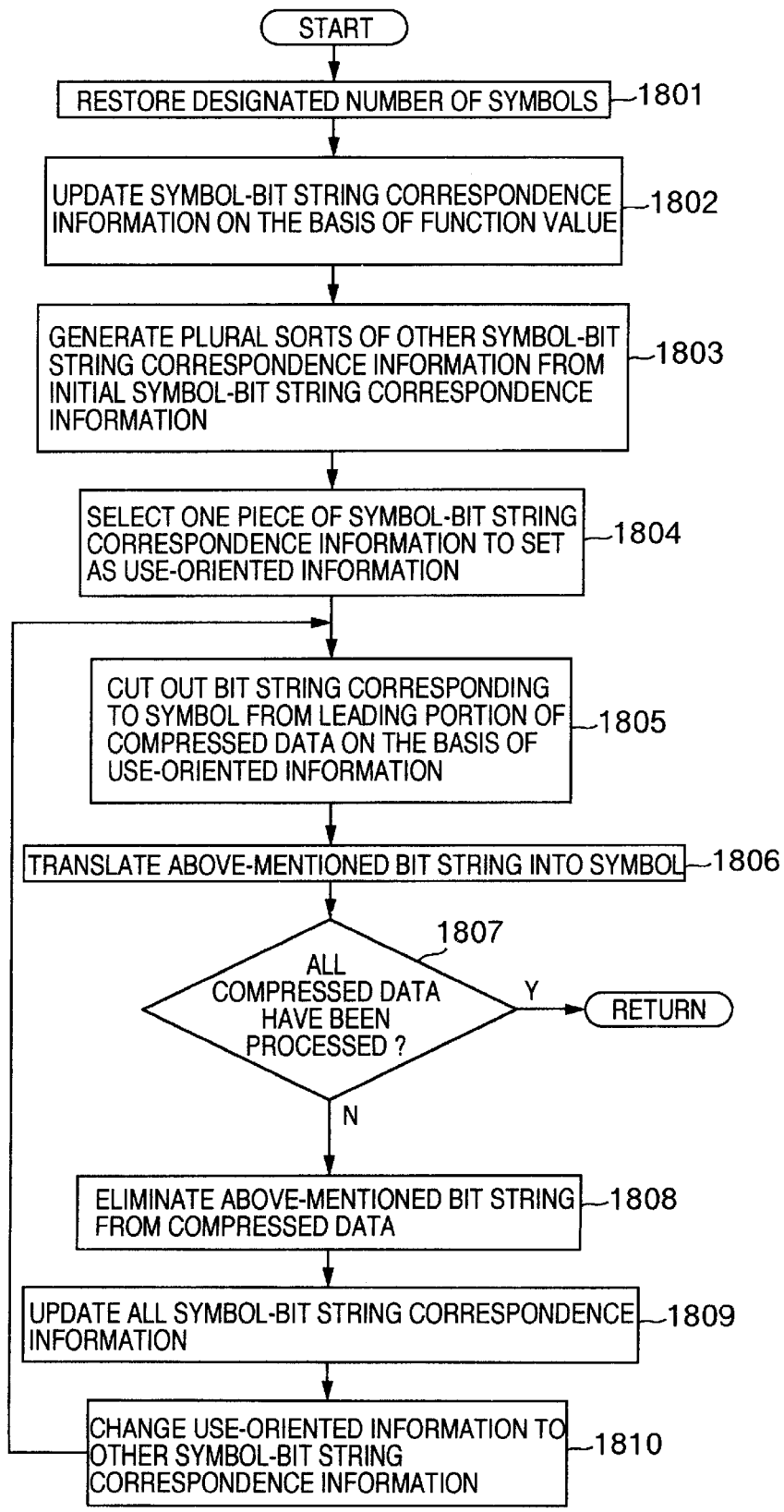
FIG. 18 is a flow chart for illustrating a procedure for decompression or restoration processing according to the third exemplary embodiment of the present invention.

Finally, the decompression processing 1519 will be elucidated in detail by reference to FIG. 18. In a step 1801, a designated number of the symbols are restored by resorting to a conventional decompression method for the adaptive Huffman compression. The value of the designated number is set to be equal to the designated value in the step 1601 described hereinbefore by reference to FIG. 16. In a step 1802, the symbol-bit string correspondence information is generated by the same method as that adopted in the step 1602 mentioned previously. In a step 1803, other initial symbol-bit string correspondence information is generated from the initial symbol-bit string correspondence information by the same method as that adopted in the step 1603 mentioned previously. In a step 1804, one sort of the symbol-bit string correspondence information is selected as the use-oriented information by the same method as that in the step 1604 mentioned previously. In a step 1805, the bit string corresponding to the symbol is cut out from the leading portion of the compressed data on the basis of the use-oriented information. The processings from this step to a step 1808 are similar to those in the steps 703 to 706 described hereinbefore in conjunction with the first exemplary embodiment.

In a step 1809, the symbol occurrence probability predicting information is modified in dependence on the symbol restored immediately before to thereby alter all the symbol-bit string correspondence information on the basis of the modified value. In actual applications, the structure of the single Huffman tree representing all the symbol-bit string correspondence information is altered. In a step 1810, the use-oriented information is changed to the other symbol-bit string correspondence information by the same method as that adopted in the step 1609, whereupon the step 1803 is resumed.

As is apparent from the foregoing, according to the teachings incarnated in the instant embodiment, the raw data can be compressed and encrypted while the compressed/encrypted data can be decrypted and decompressed for restoring the original raw data.

Because the amount of the data which are to undergo the compression/encryption at one time as well as the amount of the data to undergo the decryption/ decompression at one time are set so that the memory capacity required for the compression/encryption processings and decryption/ decompression processings of the data does not exceed the capacity of the main storage incorporated in the information processing system, the compression/encryption processings as well as the decryption/decompression processings can be performed internally of the main storage, whereby write operation of the interim results into the secondary storage is rendered unnecessary, which in turn means that improvement of the efficiency and reduction of the power consumption can be achieved.

In the encryption processing according to the conventional compression/encryption method known heretofore, the encryption processing is applied to the whole compressed data. By contrast, according to the instant embodiment, encryption of the raw data is realized by (1) generating the symbol-bit string correspondence information on the basis of the function value, (2) changing the symbol-bit string correspondence information, and (3) applying the encryption processing to the leading portion of the compressed data.

In the processing (1), "0" and "1" are affixed to the branches of the Huffman tree. As described in conjunction with the first exemplary embodiment, the Huffman tree has the leaf nodes in a number equal to the number of different symbols, respectively, wherein the number of branches is given by (the number of the different symbols $-1) \times 2$. Because the number of the different symbols is on the order of 300 at the most, the processing (1) is only required to affix "0" or "1" to the branches on the order of 600 at the most, which can be executed within a negligibly short time when compared with the conventional processing for applying the complicate encryption to the compressed data of several kilo to several mega bytes. Similarly, the time taken for the processing (2) is negligibly short. The processing (3) is required to encrypt the leading portion of the compressed data, e.g. 100 different symbols, which can be executed within a negligibly short time when compared with the conventional processing for applying encryption to the whole compressed data (usually of several-ten to several-hundred thousand symbols).

On the other hand, in the decryption processing according to the conventional decryption/decompression method, the decryption processing is applied to the whole compressed/ encrypted data. By contrast, according to the teachings incarnated in the instant embodiment, the compressed/ encrypted data is decrypted by (1) generating the symbol-bit string correspondence information on the basis of the function value, (2) changing the symbol-bit string correspondence information and (3) applying the decryption processing to the leading portion of the compressed/encrypted data. The time taken for these processings (1) to (3) is negligibly short as in the case of the encryption processing. For these reasons, the time taken for the decryption/decompression can be shortened according to the teachings incarnated in the instant embodiment.

As is apparent from the foregoing, since the processing for compressing and encrypting data as well as the processing for decrypting and decompressing the compressed/ encrypted data can be executed internally of the main storage of the relevant information processing system according to the teachings of the invention, write/read operations of the interim results to/from the secondary storage can be rendered unnecessary, which means that enhancement of the efficiency and reduction in the electric power consumption can be achieved.

Besides, because the computational overhead involved in the processings for compressing and encrypting data as well as the processings for decrypting and decompressing the compressed/encrypted data can be reduced according to the present invention, improvement of the efficiency can be achieved.

What is claimed is:

1. In an information processing system for compressing and encrypting a set of input data said system including a processing unit, a main storage and a secondary storage having a lower processing speed than that of said main storage, a data compression/encryption method, said method comprising:

partitioning said input data set based on an empty capacity of said main storage and based on a data size where a result of a processing of each partitioned input data set performed by said processing unit can be stored in said main storage rather than said secondary storage; and performing compression/encryption processings in cooperation with said main storage on a partitioned-data basis.

2. An information processing system for compressing and encrypting a set of input data said system including a processing unit, a main storage and a secondary storage having a lower processing speed than that of said main storage, said system further including a data compression/ encryption system comprising:

data compressing means for partitioning said input data set based on an empty capacity of said main storage and based on a data size where a result of a processing of each partitioned input data set performed by said processing unit can be stored in said main storage rather than said secondary storage, and compressing said data on a partitioned-data basis, the data resulting from said compression being stored in said main storage, encrypting means for performing encryption processing on said data resulting from said compression and stored in said main storage to thereby output encrypted compressed data, and control means for controlling repetitively a series of processings performed by said data compressing means and said encrypting means until all the data of said inputted data set have been compressed and encrypted.

3. An information processing system for compressing and encrypting data, said system including a main storage and a secondary storage, said secondary storage having a lower processing speed than that of said main storage, said system further including a data compression/encryption system comprising:

data input means for inputting one set of data and storing said one set of data in said secondary storage, data compressing means for partitioning said input data set based on an empty capacity of said main storage of said and based on a data size where a result of a processing of each partitioned input data set performed by said processing unit can be stored in said main storage rather than said secondary storage, and reading out said data on a partitioned-data basis for compression thereof, the data resulting from said compression being stored in said main storage, encrypting means for performing encryption processing on said compressed data stored in said main storage and storing the compressed and encrypted data in said secondary storage, and control means for controlling repetitively a series of processings performed by said data compressing means and said encrypting means until all the data of said input data set have been compressed and encrypted.

4. In an information processing system for compressing and encrypting a set of input data, said system including a processing unit, a main storage and a secondary storage having a lower processing speed than that of said main storage, a data compression/encryption method, said method comprising:

partitioning said input data set based on an empty capacity of said main storage as allocated to said compression/encryption processings and based on a data size where a result of a processing of each partitioned input data set performed by said processing unit can be stored in said main storage rather than said secondary storage, and performing compression/encryption processings in cooperation with said main storage on a partitioned-data basis.

5. An information processing system for compressing and encrypting a set of input data, said system including a processing unit, a main storage and a secondary storage having a lower processing speed than that of said main storage, said system further including a data compression/encryption system comprising:

data compressing means for partitioning said input data set based on an empty capacity of said main storage as allocated to said compression/encryption processings and based on a data size where a result of a processing of each partitioned input data set performed by said processing unit can be stored in said main storage rather than said secondary storage, and compressing said data on a partitioned-data basis, the data resulting from said compression being stored in said main storage, encrypting means for performing encryption processing on said data resulting from said compression and stored in said main storage to thereby output encrypted compressed data, and control means for controlling repetitively a series of processings performed by said data compressing means and said encrypting means until all the data of said inputted data set have been compressed and encrypted.

6. An information processing system for compressing and encrypting data, said system including a main storage and a secondary storage, said secondary storage having a lower processing speed than that of said main storage, said system further including a data compression/encryption system comprising:

data input means for inputting one set of data and storing said one set of data in said secondary storage, data compressing means for partitioning said input data set based on an empty capacity of said main storage as allocated to said compression/encryption processings and based on a data size where a result of a processing of each partitioned input data set performed by said processing unit can be stored in said main storage rather than said secondary storage, and reading out said data on a partitioned-data basis for compression thereof, the data resulting from said compression being stored in said main storage, encryption means for performing encryption processing on said compressed data stored in said main storage and storing the compressed and encrypted data in said secondary storage, and control means for controlling repetitively a series of processings performed by said data compressing means and said encrypting means until all the data of said input data set have been compressed and encrypted.

* * * * *